US012742118B2

(12) United States Patent
Won et al.

(10) Patent No.: US 12,742,118 B2
(45) Date of Patent: Sep. 22, 2026

(54) ELECTROLUMINESCENT DEVICE AND SEMICONDUCTOR NANOPARTICLE

(71) Applicant: Samsung Electronics Co., Ltd., Suwon-si (KR)

(72) Inventors: Yuho Won, Suwon-si (KR); Jeong Hee Lee, Suwon-si (KR); Eun Joo Jang, Suwon-si (KR); Hyo Sook Jang, Suwon-si (KR); Seonmyeong Choi, Suwon-si (KR)

(73) Assignees: SAMSUNG DISPLAY CO., LTD., Gyeonggi-Do (KR); SAMSUNG ELECTRONICS CO., LTD., Gyeonggi-Do (KR)

( * ) Notice: Subject to any disclaimer, the term of this patent is extended or adjusted under 35 U.S.C. 154(b) by 1016 days.

(21) Appl. No.: 17/953,533

(22) Filed: Sep. 27, 2022

(65) Prior Publication Data

US 2023/0096181 A1 Mar. 30, 2023

(30) Foreign Application Priority Data

Sep. 27, 2021 (KR) ........................ 10-2021-0127473

(51) Int. Cl.
*C09K 11/88* (2006.01)
*B82Y 30/00* (2011.01)
(Continued)

(52) U.S. Cl.
CPC ............ *C09K 11/883* (2013.01); *B82Y 30/00* (2013.01); *C09K 11/55* (2013.01); *H10K 50/115* (2023.02)

(58) Field of Classification Search
CPC ....... C09K 11/883; C09K 11/55; C09K 11/02; C09K 11/0811; C09K 11/88; C09K 11/56;
(Continued)

(56) References Cited

U.S. PATENT DOCUMENTS 11,124,703 B2 9/2021 Ogura et al.
11,257,981 B2 2/2022 Iida et al.
(Continued)

FOREIGN PATENT DOCUMENTS

CN 106381146 A 2/2017
CN 112331778 A 2/2021
(Continued)

OTHER PUBLICATIONS

Office Action dated Mar. 4, 2025 of the corresponding Korean Patent Application No. 10-2021-0127473.
(Continued)

*Primary Examiner* — Matthew E. Hoban
*Assistant Examiner* — Lynne Edmonson
(74) *Attorney, Agent, or Firm* — CANTOR COLBURN LLP

(57) ABSTRACT

An electroluminescent device includes a first electrode and a second electrode spaced apart from each other, and a light emitting layer including semiconductor nanoparticles. The semiconductor nanoparticles do not contain cadmium, the semiconductor nanoparticles include zinc, selenium, tellurium, and sulfur, the semiconductor nanoparticles have a core-shell structure including a core including a first semiconductor nanocrystal and a shell disposed on the core, the first semiconductor nanocrystals include a first zinc chalcogenide containing sulfur, in the semiconductor nanoparticles, a mole ratio of sulfur to tellurium is greater than or equal to about 0.5:1 and less than or equal to about 110:1, and the semiconductor nanoparticles are configured to emit light having a maximum emission peak wavelength of greater than or equal to about 440 nanometers (nm) and less than or equal to about 580 nm, and the semiconductor nanoparticles have a quantum yield of greater than or equal to about 40%.

21 Claims, 2 Drawing Sheets

(51) Int. Cl.

| | |
|---|---|
| ***C09K 11/55*** | (2006.01) |
| ***C09K 11/56*** | (2006.01) |
| ***H10K 50/115*** | (2023.01) |

(58) Field of Classification Search

CPC .... C09K 11/565; H10K 50/115; H10K 50/50; H10K 50/14; H10K 50/17; H10K 50/18; H10K 85/111; H10K 85/1135; B82Y 20/00; B82Y 30/00; B82Y 40/00

See application file for complete search history.

(56) References Cited

U.S. PATENT DOCUMENTS

| | | | | |
|---|---|---|---|---|
| 11,390,804 | B2 | 7/2022 | Won et al. | |
| 11,424,425 | B2 | 8/2022 | Park et al. | |
| 11,702,593 | B2 | 7/2023 | Min et al. | |
| 12,187,941 | B2 | 1/2025 | Won et al. | |
| 2020/0079649 | A1 | 3/2020 | Miyanaga et al. | |
| 2020/0224094 | A1* | 7/2020 | Won | H10H 20/812 |
| 2020/0332189 | A1* | 10/2020 | Lee | C09K 11/883 |
| 2021/0189230 | A1 | 6/2021 | Iida et al. | |
| 2021/0388263 | A1 | 12/2021 | Ogura et al. | |
| 2023/0303924 | A1 | 9/2023 | Min et al. | |

FOREIGN PATENT DOCUMENTS

| | | | |
|---|---|---|---|
| CN | 112750954 | A | 5/2021 |
| JP | 2020181196 | A | 11/2020 |
| KR | 20200032119 | A | 3/2020 |
| KR | 20200087715 | A | 7/2020 |
| KR | 20210007738 | A | 1/2021 |
| KR | 20210041373 | A | 4/2021 |
| KR | 20210110232 | A | 9/2021 |
| WO | 2019078135 | A1 | 4/2019 |

OTHER PUBLICATIONS

Hiroshi Asano et al., "Design of cadmium-free colloidal II-VI semiconductor quantum dots exhibiting RGB emission," AIP Advances, Apr. 20, 2017, pp. 1-7, No. 045309.

Somang Kim, Synthesis of Cd-free blue-emitting ZnTeS/ZnS Quantum dots and study on emission properties affected by defects, Master's Thesis, Department of Material Science and Engineering, KAIST, 2015, pp. 1-70.

Office Action dated Nov. 18, 2025 of the corresponding Korean Patent Application No. 10-2021-0127473.

* cited by examiner

ELECTROLUMINESCENT DEVICE AND SEMICONDUCTOR NANOPARTICLE

CROSS-REFERENCE TO RELATED APPLICATION

This application claims priority to and the benefit of Korean Patent Application No. 10-2021-0127473 filed in the Korean Intellectual Property Office on Sep. 27, 2021, and all the benefits accruing therefrom under 35 U.S.C. § 119, the entire content of which is incorporated herein by reference.

BACKGROUND

1. Field

The present disclosure relates to an electroluminescent device and a semiconductor nanoparticle.

2. Description of the Related Art

Semiconductor particles having a nanoscale size (e.g., semiconductor nanocrystal particles) may exhibit luminescence. For example, quantum dots including semiconductor nanocrystals may exhibit a quantum confinement effect. Light emission of semiconductor nanoparticles may be generated while electrons in an excited state transition from a conduction band to a valence band by, for example, light excitation or voltage application. Semiconductor nanoparticles may be controlled to emit light in a desired wavelength region by controlling the size, composition, or a combination thereof of the semiconductor nanoparticles. The nanoparticles may be used in a light emitting device (e.g., an electroluminescent device) and display devices including the same.

SUMMARY

An embodiment relates to a light emitting device that emits light by applying a voltage to a nanostructure (e.g., quantum dots).

An embodiment relates to a display device (e.g., a quantum dot (QD)-light emitting diode (LED) display) including nanoparticles (e.g., quantum dots) as a light emitting material in red/green/blue pixels.

An embodiment relates to a population of semiconductor nanoparticles.

In an embodiment, an electroluminescent device includes a first electrode and a second electrode spaced apart from each other (for example, facing each other), and a light emitting layer disposed between the first electrode and the second electrode, the light emitting layer including semiconductor nanoparticles, wherein semiconductor nanoparticles do not include, e.g., contain, cadmium, the semiconductor nanoparticles include zinc, selenium, tellurium, and sulfur, the semiconductor nanoparticles have a core-shell structure including a core including a first semiconductor nanocrystal and a shell disposed on the core, the first semiconductor nanocrystals include a first zinc chalcogenide including, e.g., containing, sulfur, in the semiconductor nanoparticles, a mole ratio of sulfur to tellurium (S:Te) is greater than or equal to about 0.5:1 and less than or equal to about 110:1, the semiconductor nanoparticles are configured to emit light having a maximum emission peak wavelength of greater than or equal to about 440 nanometers (nm) and less than or equal to about 580 nm, and the semiconductor nanoparticles have a quantum yield of greater than or equal to about 40%.

A mole ratio of selenium to tellurium (Se:Te) may be greater than or equal to about 1:1 and less than or equal to about 117:1.

The maximum emission peak wavelength is greater than or equal to about 445 nm and less than or equal to about 480 nm, and the quantum yield of the semiconductor nanoparticles is greater than or equal to about 50%.

The maximum emission peak wavelength may be in the range of greater than or equal to about 455 nm, for example, greater than or equal to about 458 nm, and less than or equal to about 470 nm, for example, less than or equal to about 468 nm.

The semiconductor nanocrystal may have a quantum yield of greater than or equal to about 50%, greater than or equal to about 55%, or greater than or equal to about 80%.

A maximum emission peak of light emitted by the semiconductor nanocrystals may have a full width at half maximum (FWHM) of greater than or equal to about 5 nm, greater than or equal to about 7 nm, greater than or equal to about 10 nm, greater than or equal to about 15 nm, greater than or equal to about 25 nm, greater than or equal to about 35 nm, or greater than or equal to about 40 nm and less than or equal to about 80 nm, less than or equal to about 70 nm, or less than or equal to about 65 nm.

The electroluminescent device may further include a charge auxiliary layer between the light emitting layer and the first electrode, between the light emitting layer and the second electrode, or both.

The electroluminescent device may further include a hole auxiliary layer between the light emitting layer and the first electrode.

The electroluminescent device may further include an electron auxiliary layer between the light emitting layer and the second electrode.

The electroluminescent device may further include a hole auxiliary layer between the light emitting layer and the first electrode, and may further include an electron auxiliary layer between the light emitting layer and the second electrode.

The charge auxiliary layer may include a hole auxiliary layer including an organic compound, an electron auxiliary layer including metal oxide nanoparticles, or a combination thereof.

The hole auxiliary layer may include a hole transport layer including an organic polymer compound.

The electron auxiliary layer may include zinc magnesium metal oxide nanoparticles.

An average particle size of the semiconductor nanocrystal particles may be greater than or equal to about 3 nm, greater than or equal to about 5 nm, or greater than or equal to about 7 nm and less than or equal to about 50 nm, less than or equal to about 30 nm, less than or equal to about 15 nm, less than or equal to about 10 nm, or less than or equal to about 9 nm.

In the semiconductor nanoparticles, the mole ratio of sulfur to tellurium (S:Te) may be greater than or equal to about 1:1, greater than or equal to about 1.5:1, or greater than or equal to about 2:1 and less than or equal to about 100:1, or less than or equal to about 90:1.

In the semiconductor nanoparticles, the mole ratio of sulfur to tellurium (S:Te) may be greater than or equal to about 3:1, greater than or equal to about 5:1, greater than or equal to about 7:1, greater than or equal to about 10:1, greater than or equal to about 30:1, or greater than or equal to about 50:1 and less than or equal to about 85:1, less than or equal to about 75:1, or less than or equal to about 65:1.

In the semiconductor nanoparticles, the mole ratio of sulfur to tellurium (S:Te) may be greater than or equal to about 10:1, greater than or equal to about 30:1, or greater than or equal to about 50:1 and less than or equal to about 85:1, less than or equal to about 80:1, less than or equal to about 75:1, or less than or equal to about 65:1.

In the semiconductor nanoparticles, a mole ratio of zinc to tellurium (Zn:Te) may be greater than or equal to about 1, greater than or equal to about 50:1, or greater than or equal to about 100:1, and less than or equal to about 260:1, less than or equal to about 250:1, less than or equal to about 200:1, less than or equal to about 180:1, less than or equal to about 150:1, or less than or equal to about 140:1.

In the semiconductor nanoparticles, a mole ratio of sulfur to selenium (S:Se) may be greater than or equal to about 0.01:1, greater than or equal to about 0.03:1, greater than or equal to about 0.0:15, or greater than or equal to about 0.1:1.

In the semiconductor nanoparticles, the mole ratio of sulfur to selenium (S:Se) may be less than or equal to about 3:1, less than or equal to about 2:1, or less than or equal to about 1:1.

The first zinc chalcogenide may further include tellurium.

The shell may include a second zinc chalcogenide including, e.g., containing, selenium having a different composition from the first zinc chalcogenide, a magnesium chalcogenide, or a combination thereof.

The shell may include a first shell layer including a second zinc chalcogenide including, e.g., containing, zinc, selenium, and optionally further including sulfur and a second shell layer disposed on the first shell layer, the second shell layer including a third zinc chalcogenide including, e.g., containing, zinc, sulfur, and optionally further including selenium.

In the shell, the second zinc chalcogenide and the third zinc chalcogenide may have different compositions.

The shell may include zinc, and selenium, sulfur, tellurium, or a combination thereof.

In an embodiment, the shell may not include tellurium.

In an embodiment, the first semiconductor nanocrystal may not include selenium.

In an embodiment, the semiconductor nanoparticles may not include copper.

The electroluminescent device may have a maximum external quantum efficiency (Max EQE) of greater than or equal to about 7.5% and less than or equal to about 100%.

The electroluminescent device may have a maximum luminance of greater than or equal to about 10,000 candelas per square meter (cd/m$^2$) and less than or equal to about 1,000,000 cd/m$^2$.

The electroluminescent device may have a maximum external quantum efficiency (Max EQE) of greater than or equal to about 7.5% or greater than or equal to about 8% and less than or equal to about 40%, a maximum luminance of greater than or equal to about 400,000 cd/m$^2$, or greater than or equal to about 450,000 nit (cd/m$^2$) and less than or equal to about 10,000,000 cd/m$^2$, or less than or equal to about 1,000,000 cd/m$^2$.

An embodiment relates to a display device including the aforementioned electroluminescent device.

The display device may include a portable terminal device, a monitor, a notebook computer, a television, an electric sign board, a camera, or an electronic component.

In an embodiment, the (luminescent) population includes a plurality of semiconductor nanoparticles including zinc, selenium, tellurium, and sulfur, wherein the semiconductor nanoparticles do not include, e.g., contain, cadmium, in the semiconductor nanoparticles, a mole ratio of sulfur to tellurium is greater than or equal to about 0.5:1 and less than or equal to about 110:1, the semiconductor nanoparticles are configured to emit light having a maximum emission peak wavelength of greater than or equal to about 440 nm and less than or equal to about 580 nm, and the semiconductor nanoparticles exhibit a quantum yield of greater than or equal to about 80%.

In an embodiment, in the semiconductor nanoparticles, a mole ratio of selenium to tellurium is greater than or equal to about 1:1 and less than or equal to about 117:1.

The semiconductor nanoparticles included in the population may have one or more of the characteristics described herein.

The quantum yield may be greater than or equal to about 85%, or greater than or equal to about 90%.

In the semiconductor nanoparticles, mole ratio of sulfur to tellurium (S:Te) may be greater than or equal to about 1:1 and less than or equal to about 85:1.

In the semiconductor nanoparticles, the mole ratio of sulfur to tellurium (S:Te) may be greater than or equal to about 10:1 and less than or equal to about 80:1.

In the semiconductor nanoparticles, the mole ratio of zinc to tellurium (Zn:Te) may be greater than or equal to about 80:1 or greater than or equal to about 100:1 and less than or equal to about 250:1.

In the semiconductor nanoparticles, a mole ratio of sulfur to selenium may be greater than or equal to about 0.01:1 or greater than or equal to about 0.05:1 and less than or equal to about 1.3:1.

The semiconductor nanoparticles have a core-shell structure including a core including a first semiconductor nanocrystal and a shell disposed on the core, the first semiconductor nanocrystal includes, e.g., contains, tellurium, and in an embodiment, the shell may not include tellurium.

In an embodiment, the method for preparing the population includes:

obtaining a first semiconductor nanocrystal including, e.g., containing, zinc, sulfur, and tellurium; synthesizing a semiconductor nanocrystal including a zinc chalcogenide including, e.g., containing, selenium in the presence of the first semiconductor nanocrystal, wherein the obtaining of the first semiconductor nanocrystal includes heating a reaction medium including an organic amine compound; and adding a zinc precursor, a tellurium precursor stock solution, a sulfur precursor, and performing a reaction in the heated reaction medium, wherein the tellurium precursor stock solution includes a tellurium compound, a reducing compound (e.g., a reducing agent), and an organic amine compound.

The sulfur precursor may include a compound in which an organic ligand is bonded to sulfur. The organic ligand may include a trialkylsilyl group, a trialkylsilylalkyl group, or a combination thereof. The sulfur precursor may include bis(trialkylsilyl)sulfide, bis(trialkylsilylalkyl)sulfide, or a combination thereof.

The organic amine compound may include a $C_{5-50}$ primary amine compound. The primary amine compound may have a $C_{5-50}$ alkenyl group, a $C_{5-50}$ alkynyl group, or a $C_{5-50}$ alkyl group.

The zinc precursor may include alkylated zinc.

In an embodiment, the reaction system may not include a copper compound.

In the reaction, a content of the sulfur compound per 1 mole of the tellurium compound may be greater than or equal to about 2.5 moles, or greater than or equal to about 3 moles, and less than or equal to about 8 moles, or less than or equal to about 4 moles.

In an embodiment, a display device or an electronic device may include the semiconductor nanoparticles.

The display device or the electronic device may include a portable terminal device, a monitor, a notebook computer, a television, an electric sign board, a camera, or an electronic component for a vehicle.

In an embodiment, a semiconductor nanoparticle includes a core including a first semiconductor nanocrystal including $ZnTe_xS_{1-x}$, wherein x is greater than or equal to about 0.2 and less than or equal to about 0.5; and a shell disposed on the core, the shell including zinc and selenium, wherein in the semiconductor nanoparticle, a mole ratio of sulfur to tellurium is greater than or equal to about 0.5:1 and less than or equal to about 110:1 and the semiconductor nanoparticle is configured to emit light having a maximum emission peak wavelength of greater than or equal to about 440 nanometers and less than or equal to about 580 nanometers, and optionally wherein a mole ratio of selenium to tellurium is greater than or equal to about 1:1 and less than or equal to about 117:1.

According to an embodiment, the semiconductor nanoparticles and the light emitting layer or the electroluminescent device including the same may provide light of a desired wavelength with improved efficiency (e.g., absolute quantum yield) without including harmful heavy metals such as cadmium. The semiconductor nanoparticles of an embodiment may implement increased electron-hole overlap, and an electronic device (e.g., an electroluminescent device) including the same may exhibit improved physical properties (e.g., electroluminescent properties).

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
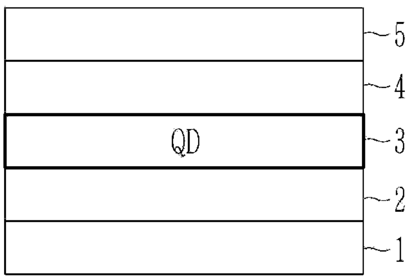
FIG. 1 is a schematic cross-sectional view of a QD LED device according to an embodiment.

Hereinafter, with reference to the accompanying drawings, various embodiments of the present disclosure will be described in detail so that those of ordinary skill in the art can carry out the present disclosure. The present disclosure may be embodied in many different forms and is not limited to the embodiments described herein.

In order to clearly explain the present disclosure, parts irrelevant to the description are omitted, and the same reference numerals are assigned to the same or similar elements throughout the specification.

The size and thickness of each constituent element as shown in the drawings are indicated for better understanding and ease of description, and this disclosure is not necessarily limited to sizes or thicknesses as shown. In the drawings, the thickness of layers, films, panels, regions, etc., are exaggerated for clarity. And in the drawings, for convenience of description, the thickness of some layers and regions are exaggerated.

In addition, it will be understood that when an element such as a layer, film, region, or substrate is referred to as being "on" another element, it can be directly on the other element or intervening elements may also be present. In contrast, when an element is referred to as being "directly on" another element, there are no intervening elements present. Also, to be disposed "on" the reference portion means to be disposed above or below the reference portion, and does not necessarily mean "above" in an opposite direction of gravity.

In addition, unless explicitly described to the contrary, the word "comprise" and variations such as "comprises" or "comprising" will be understood to imply the inclusion of stated elements but not the exclusion of any other elements.

Further, in the entire specification, the phrase "cross-sectional view" means a view in which a cross-section of the target part that is cut in a vertical direction is viewed from the side.

Further, the singular includes the plural unless mentioned otherwise. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "or" means "and/or." As used herein, the term "and/or" includes any and all combinations of one or more of the associated listed items.

In the drawings, the thickness of layers, films, panels, regions, etc., are exaggerated for clarity.

It will be understood that, although the terms "first," "second," "third," etc., may be used herein to describe various elements, components, regions, layers, and/or sections, these elements, components, regions, layers and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

Unless otherwise defined, all terms (including technical and scientific terms) used herein have the same meaning as commonly understood by one of ordinary skill in the art to which this disclosure belongs. It will be further understood that terms, such as those defined in commonly used, e.g., non-technical, dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, a value of a work function or (highest occupied molecular orbital (HOMO) or lowest unoccupied molecular orbital (LUMO)) energy level is expressed as an absolute value from a vacuum level. In addition, when the work function or the energy level is referred to be "deep," "high" or "large," the work function or the HOMO energy level has a large absolute value based on "0 electronvolts (eV)" of the vacuum level, while when the work function or the energy level is referred to be "shallow," "low," or "small," the work function or energy level has a small absolute value based on "0 eV" of the vacuum level.

As used herein, a number of carbon atoms in a group or a molecule may be referred to as a subscript (e.g., $C_{6-50}$) or as C6 to C50.

As used herein, when a definition is not otherwise provided, "substituted" refers to replacement of a, e.g., at least one, hydrogen of a compound or the corresponding moiety by a C1 to C30 alkyl group, a C1 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group ($—NO_2$), a cyano group (—CN), an amino group (—NRR' wherein R and R' are each independently hydrogen or a C1 to C6 alkyl group), an azido group ($—N_3$), an amidino group ($—C(=NH)NH_2$), a hydrazino group ($—NHNH_2$), a hydrazono group ($=N(NH_2)$), an aldehyde group (—C(=O)H), a carbamoyl group ($—C(O)NH_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group ($—SO_3H$) or a salt thereof ($—SO_3M$, wherein M is an organic or inorganic cation), a phosphoric acid group ($—PO_3H_2$) or a salt thereof ($—PO_3MH$ or $—PO_3M_2$, wherein M is an organic or inorganic cation), or a combination thereof.

As used herein, when a definition is not otherwise provided, "hydrocarbon" or "hydrocarbon group" refers to a group including, e.g., containing, carbon and hydrogen (e.g., an aliphatic group such as alkyl, alkenyl, alkynyl, or an aromatic group such as an aryl group). The hydrocarbon group may be a monovalent group or a group having a valence of greater than one formed by removal of a, e.g., one or more, hydrogen atoms from, alkane, alkene, alkyne, or arene. In the hydrocarbon group, a, e.g., at least one, methylene may be replaced by an oxide moiety, a carbonyl moiety, an ester moiety, —NH—, or a combination thereof. Unless otherwise stated to the contrary, the hydrocarbon (alkyl, alkenyl, alkynyl, or aryl) group may have 1 to 60, 2 to 32, 3 to 24, or 4 to 12 carbon atoms.

As used herein, when a definition is not otherwise provided, "alkyl" refers to a linear or branched saturated monovalent hydrocarbon group (methyl, ethyl hexyl, etc.). Unless specified otherwise, an alkyl group has from 1 to 50 carbon atoms, or 1 to 18 carbon atoms, or 1 to 12 carbon atoms.

As used herein, when a definition is not otherwise provided, "alkenyl" refers to a linear or branched monovalent hydrocarbon group having a, e.g., one or more, carbon-carbon double bond. Unless specified otherwise, an alkenyl group has from 2 to 50 carbon atoms, or 2 to 18 carbon atoms, or 2 to 12 carbon atoms.

As used herein, when a definition is not otherwise provided, "alkynyl" refers to a linear or branched monovalent hydrocarbon group having a, e.g., one or more, carbon-carbon triple bond. Unless specified otherwise, an alkenyl group has from 2 to 50 carbon atoms, or 2 to 18 carbon atoms, or 2 to 12 carbon atoms.

As used herein, when a definition is not otherwise provided, "aryl" refers to a group formed by removal of a, e.g., at least one, hydrogen from an aromatic group (e.g., a phenyl or naphthyl group). Unless specified otherwise, an aryl group has from 6 to 50 carbon atoms, or 6 to 18 carbon atoms, or 6 to 12 carbon atoms.

As used herein, when a definition is not otherwise provided, "hetero" refers inclusion of 1 to 3 heteroatoms, e.g., N, O, S, Si, P, or a combination thereof.

As used herein, when a definition is not otherwise provided, "alkoxy" refers to an alkyl group linked via an oxygen (i.e., alkyl-O—), such as a methoxy, ethoxy, or sec-butyloxy group.

As used herein, when a definition is not otherwise provided, "amine" or "amine group" may be —NRR, (each R is independently hydrogen, a C1-C12 alkyl group, a C7-C20 alkylarylene group, a C7-C20 arylalkylene group, or a C6-C18 aryl group).

As used herein, when a definition is not otherwise provided, "alkylene group" refers to a straight or branched saturated aliphatic hydrocarbon group having at least two valences and optionally substituted with a, e.g., at least one, substituent.

As used herein, when a definition is not otherwise provided, "arylene group" refers to a functional group having at least two valences obtained by removal of at least two hydrogens in an, e.g., at least one, aromatic ring, and optionally substituted with a, e.g., at least one, substituent.

As used herein, when a definition is not otherwise provided, "aliphatic group" or "aliphatic hydrocarbon" refers to a saturated or unsaturated linear or branched C1 to C30 group consisting of carbon and hydrogen, and "aromatic organic group" includes a C6 to C30 aryl group or a C2 to C30 heteroaryl group, and "alicyclic group" refers to a saturated or unsaturated C3 to C30 cyclic group consisting of carbon and hydrogen.

Herein, a description of not containing cadmium (or other toxic heavy metal) may refer to a concentration of cadmium (or a corresponding heavy metal) of less than or equal to about 100 parts per million by weight (ppmw), less than or equal to about 50 ppmw, less than or equal to about 10 ppmw, or about, e.g., almost, zero. In an embodiment, no cadmium (or other heavy metal) is present, or, if present, cadmium (or other heavy metal) is present in an amount or impurity level below the detection limit of a given detection means.

In an embodiment, the term "chalcogen" may be inclusive of sulfur (S), selenium (Se), and tellurium (Te), and may not include oxygen (O).

Unless otherwise stated, numerical ranges stated herein are inclusive.

As used herein, the upper and lower endpoints set forth for various numerical values may be independently combined to provide a range.

As used herein, "about" means not only the stated value, but also the mean within an acceptable range of deviations, considering the errors associated with the corresponding measurement and the measurement of the measured value. For example, "about" can mean within ±10%, 5%, 3%, or 1% or within standard deviation of the stated value.

As used herein, a nanostructure refers to a, e.g., at least one, region having a nanoscale dimension or a structure having a characteristic dimension. In an embodiment, the dimension of the nanoparticle may be less than or equal to about 300 nm, less than or equal to about 250 nm, less than or equal to about 150 nm, less than or equal to about 100 nm, less than or equal to about 50 nm, or less than or equal to about 30 nm. Nanostructures may have any suitable shape.

Unless otherwise specified herein, the nanoparticles or semiconductor nanoparticles may have any suitable shape, such as nanowires, nanorods, nanotubes, multi-pod type shapes having two or more pods, nanodots (or quantum dots), etc., and are not particularly limited. The nanoparticles may be, for example, substantially crystalline, substantially monocrystalline, polycrystalline, amorphous, or a combination thereof.

For example, semiconductor nanoparticles such as quantum dots may exhibit quantum confinement or exciton confinement. In the present specification, the term "nanoparticles or quantum dots" are not limited in shapes thereof unless specifically defined. Semiconductor nanoparticles, such as quantum dots, may have a size smaller than a diameter of Bohr excitation in the bulk crystal of the same material, and may exhibit a quantum confinement effect. Quantum dots may emit light corresponding to a bandgap energy thereof by controlling the size of the emission center of the nanocrystals.

As used herein, quantum efficiency is a term used interchangeably with quantum yield. Quantum efficiency (or quantum yield) may be measured either in solution or in the solid state (in a composite). In an embodiment, quantum efficiency (or quantum yield) is the ratio, e.g., relative value, of photons emitted to photons absorbed by the nanostructure or population thereof. In an embodiment, quantum efficiency may be measured by any suitable method. For example, for fluorescence quantum yield or efficiency, there may be two methods: an absolute method and a relative method.

In the absolute method, quantum efficiency is obtained by detecting the fluorescence of all samples through an integrating sphere. In the relative method, the quantum efficiency of the unknown sample is calculated by comparing the fluorescence intensity of a standard dye (standard sample) with the fluorescence intensity of the unknown sample. Coumarin 153, Coumarin 545, Rhodamine 101 inner salt, Anthracene and Rhodamine 6G may be used as standard dyes according to photoluminescence (PL) wavelengths thereof, but the present disclosure is not limited thereto.

Bandgap energies of quantum dots may be changed according to sizes, structures, and compositions of the quantum dots. For example, as the sizes of quantum dots increase, the quantum dots may have narrower bandgap energies and increased emission wavelengths. Semiconductor nanocrystals may be used as light emitting materials in, for example, various fields of, a display device, an energy device, or a bio light emitting device. Semiconductor nanoparticles having electroluminescent properties at a desirable, e.g., practically applicable, level may contain harmful heavy metals such as cadmium (Cd), lead, mercury, or a combination thereof. It is desirable to provide a light emitting device or a display device having a light emitting layer free of a harmful heavy metal, or if present, in an amount or impurity level below the detection limit of a given detection means.

An electroluminescent device according to an embodiment is a self-luminous type light emitting device configured to emit a desired light by applying a voltage without a separate light source. The light emitting device and the display device of an embodiment are desirable from an environmental point of view.

In an embodiment, the electroluminescent device includes: a first electrode 1 and a second electrode 5 which are spaced apart (e.g., facing each other); and a light emitting layer 3 that is disposed between the first electrode and the second electrode and does not contain cadmium (Refer to FIG. 1). The first electrode may include an anode, and the second electrode may include a cathode. The first electrode may include a cathode and the second electrode may include an anode. The electroluminescent device may further include a hole auxiliary layer 2 between the light emitting layer and the first electrode. The electroluminescent device may further include an electron auxiliary layer 4 between the light emitting layer and the second electrode.

Figure 2:
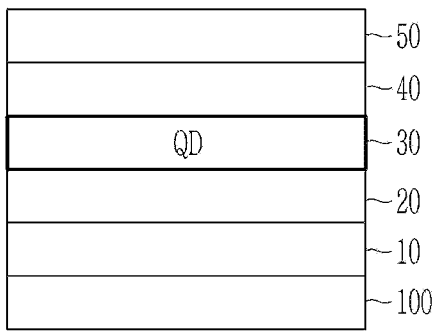
FIG. 2 is a schematic cross-sectional view of a QD LED device according to an embodiment.
Figure 3:
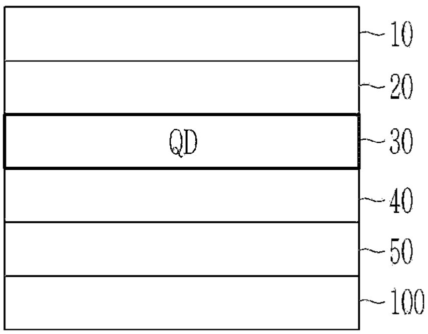
FIG. 3 is a schematic cross-sectional view of a QD LED device according to an embodiment.

In the electroluminescent device, the first electrode 10 or the second electrode 20 may be disposed on a (transparent) substrate 100. The transparent substrate may be a light extraction surface. (Refer to FIGS. 2 and 3) Referring to FIGS. 2 and 3, the light emitting layer 30 may be disposed between the first electrode (e.g., an anode) 10 and the second electrode (e.g., a cathode) 50. The second electrode or cathode 50 may include an electron injection conductor. The first electrode or anode 10 may include a hole injection conductor. A work function of the electron/hole injection conductor included in the second electrode and the first electrode may be appropriately adjusted and is not particularly limited. For example, the second electrode may have a small work function, and the first electrode may have a relatively large work function, or vice versa.

The electron/hole injection conductors may include a metal-based material (e.g., a metal, a metal compound, an alloy, or a combination thereof) (aluminum, magnesium, tungsten, nickel, cobalt, platinum, palladium, calcium, LiF, etc.), a metal oxide such as gallium indium oxide or indium tin oxide (ITO), or a conductive polymer (e.g., having a relatively high work function) such as polyethylene dioxythiophene, but are not limited thereto.

The first electrode, the second electrode, or a combination thereof may be a light-transmitting electrode or a transparent electrode. In an embodiment, both the first electrode and the second electrode may be a light-transmitting electrode. The electrode may be patterned. The first electrode, the second electrode, or a combination thereof may be disposed on a (e.g., insulating) substrate 100. The substrate 100 may be optically transparent (e.g., may have a light transmittance of greater than or equal to about 50%, greater than or equal to about 60%, greater than or equal to about 70%, greater than or equal to about 80%, greater than or equal to about 85%, or greater than or equal to about 90% and for example, less than or equal to about 99%, or less than or equal to about 95%). The substrate may further include a region for a blue pixel, a region for a red pixel, a region for a green pixel, or a combination thereof. A thin film transistor may be disposed in each region of the substrate, and one of a source electrode and a drain electrode of the thin film transistor may be electrically connected to the first electrode or the second electrode.

The light-transmitting electrode may be disposed on a (e.g., insulating) transparent substrate. The substrate may be rigid or flexible. The substrate may be plastic, glass, or a metal.

The light-transmitting electrode may be made of, for example, a transparent conductor such as indium tin oxide (ITO) or indium zinc oxide (IZO), gallium indium tin oxide, zinc indium tin oxide, titanium nitride, polyaniline, LiF/Mg:Ag, or the like, or a thin metal thin film of a single layer or a plurality of layers, but is not limited thereto. When one of the first electrode and the second electrode is an opaque electrode, the opaque electrode may be made of an opaque conductor such as aluminum (Al), a lithium-aluminum (Li:Al) alloy, a magnesium-silver alloy (Mg:Ag), or a lithium fluoride-aluminum (LiF:Al) compound.

The thickness of each of the electrodes (the first electrode, the second electrode, or each of the first electrode and the second electrode) is not particularly limited and may be appropriately selected taking into consideration device efficiency. For example, the thickness of the electrode may be greater than or equal to about 5 nm, greater than or equal to about 10 nm, greater than or equal to about 20 nm, greater than or equal to about 30 nm, greater than or equal to about 40 nm, or greater than or equal to about 50 nm. For example, the thickness of the electrode may be less than or equal to about 100 micrometers (μm), less than or equal to about 90 μm, less than or equal to about 80 μm, less than or equal to about 70 μm, less than or equal to about 60 μm, less than or equal to about 50 μm, less than or equal to about 40 μm, less than or equal to about 30 μm, less than or equal to about 20 μm, less than or equal to about 10 μm, less than or equal to about 1 μm, less than or equal to about 900 nm, less than or equal to about 500 nm, or less than or equal to about 100 nm.

A light emitting layer 3 or 30 is disposed between the first electrode 1 and the second electrode 5 (e.g., the anode 10 and the cathode 50. The light emitting layer includes semiconductor nanoparticle (e.g., blue light emitting nanoparticles, red light emitting nanoparticles, or green light emitting nanoparticles). The light emitting layer may include a, e.g., one or more (e.g., 2 or more or 3 or more and 10 or less), monolayers of a plurality of nanoparticles.

The light emitting layer may be patterned. In an embodiment, the patterned light emitting layer may include a blue light emitting layer (e.g., disposed within a blue pixel in a display device to be described herein), a red light emitting layer (e.g., disposed within a red pixel in a display device to be described herein), and a green light emitting layer (e.g., disposed within a green pixel in a display device to be described herein)), or a combination thereof. Each of the light emitting layers may be (e.g., optically) separated from an adjacent light emitting layer by a partition wall. In an embodiment, a partition wall such as a black matrix may be disposed between the red light emitting layer, the green light emitting layer, and the blue light emitting layer. The red light emitting layer, the green light emitting layer, and the blue light emitting layer may each be optically isolated.

In an embodiment, the light emitting layer or semiconductor nanoparticle may not include cadmium. In an embodiment, the light emitting layer or semiconductor nanoparticle may not include mercury, lead, or a combination thereof.

The semiconductor nanoparticles included in the light emitting layer 3 or 30 include zinc, selenium, tellurium, and sulfur.

The semiconductor nanoparticles may have a core-shell structure including a core including a first semiconductor nanocrystal and a shell disposed on the core.

the first semiconductor nanocrystals include a first zinc chalcogenide containing sulfur, In the semiconductor nanoparticles, a mole ratio of sulfur to tellurium (S:Te) is greater than or equal to about 1:1 and less than or equal to about 110:1 and a mole ratio of selenium to tellurium (Se:Te) is greater than or equal to about 1:1 and less than or equal to about 117:1. The semiconductor nanoparticles are configured to emit light having a maximum emission peak wavelength of greater than or equal to about 440 nm and less than or equal to about 580 nm. The quantum yield of the semiconductor nanoparticles may be greater than or equal to about 40%, or greater than or equal to about 80%.

Accordingly, an embodiment relates to the semiconductor nanoparticles or a population thereof. In an embodiment, the population of the luminescent nanoparticles includes a plurality of semiconductor nanoparticles, wherein semiconductor nanoparticles do not contain cadmium, the semiconductor nanoparticles include zinc, selenium, tellurium, and sulfur, in the semiconductor nanoparticles, a mole ratio of sulfur to tellurium is greater than or equal to about 1:1 and less than or equal to about 110:1, a mole ratio of selenium to tellurium is greater than or equal to about 1:1 and less than or equal to about 117:1, the semiconductor nanoparticles are configured to emit light having a maximum emission peak wavelength of greater than or equal to about 440 nm and less than or equal to about 580 nm, and the semiconductor nanoparticles exhibit a quantum yield of greater than or equal to about 80%.

The semiconductor nanoparticles included in the population or the light emitting layer may exhibit characteristic as described herein.

The semiconductor nanoparticles have an average particle size (e.g., an average diameter or average equivalent diameter of particles that can be identified by an electron microscope) of greater than or equal to about 3 nm, greater than or equal to about 4 nm, greater than or equal to about 5 nm, greater than or equal to about 6 nm, greater than or equal to about 7 nm, greater than or equal to about 8 nm, greater than or equal to about 9 nm, or greater than or equal to about 10 nm. The (average) size of the nanoparticle may be less than or equal to about 50 nm, for example, less than or equal to about 40 nm, less than or equal to about 35 nm, less than or equal to about 29 nm, less than or equal to about 28 nm, less than or equal to about 27 nm, less than or equal to about 26 nm, less than or equal to about 25 nm, less than or equal to about 24 nm, less than or equal to about 23 nm, less than or equal to about 22 nm, less than or equal to about 21 nm, less than or equal to about 20 nm, less than or equal to about 19 nm, less than or equal to about 18 nm, less than or equal to about 17 nm, less than or equal to about 16 nm, less than or equal to about 15 nm, less than or equal to about 14 nm, less than or equal to about 13 nm, less than or equal to about 12 nm, less than or equal to about 11 nm, less than or equal to about 10 nm, or less than or equal to about 9 nm. In an embodiment, the average may be a mean average. In an embodiment, the average may be a median.

The semiconductor nanoparticles of an embodiment have a particle size standard deviation of about 1% to about 20%, about 2% to about 19%, about 3% to about 18%, about 4% to about 17%, about 5% to about 16%, about 6% to about 14%, about 7% to about 13%, about 8% to about 12%, about 9% to about 11%, or a combination thereof. In the semiconductor nanoparticles of an embodiment, the standard deviation of the particle size may be less than or equal to about 10%, less than or equal to about 9%, less than or equal to about 8%, less than or equal to about 7%, less than or equal to about 6%, or less than or equal to about 5%.

The particle size may reproducibly be obtained, for example (according to a manual etc. provided by the manufacturer), from photographs of the particles which are taken by using an electron microscope (e.g., scanning electron microscope or transmission electron microscope), a suitable, e.g., commercially available, image analysis tool (e.g., image J), or a combination thereof. The image analysis tool is not particularly limited.

In an embodiment, the semiconductor nanoparticles (or the core, the shell, or a combination thereof) may not include a Group III-V compound containing indium, gallium, or a combination thereof, manganese, copper, or a combination thereof.

The semiconductor nanoparticles may further include lithium, aluminum, or a combination thereof.

In an embodiment, the first zinc chalcogenide may further include tellurium. The first semiconductor nanocrystal or the core may include zinc, tellurium, and sulfur. The average size of the core may be greater than or equal to about 2 nm, greater than or equal to about 2.5 nm, greater than or equal to about 3 nm, greater than or equal to about 3.3 nm, greater than or equal to about 3.5 nm, greater than or equal to about 3.7 nm, greater than or equal to about 4 nm, or greater than or equal to about 4.2 nm. The average size of the core may be less than or equal to about 6 nm, for example, less than or equal to about 5.5 nm, less than or equal to about 5 nm, less than or equal to about 4.5 nm, or less than or equal to about 4 nm.

The first semiconductor nanocrystal may include $ZnTe_xS_{1-x}$ (wherein, x is greater than or equal to about 0.2, greater than or equal to about 0.21, greater than or equal to about 0.22, greater than or equal to about 0.23, greater than or equal to about 0.24, greater than or equal to about 0.25, greater than or equal to about 0.26, greater than or equal to about 0.27, greater than or equal to about 0.28, greater than or equal to about 0.29, or greater than or equal to about 0.3 and less than or equal to about 0.5, less than or equal to about 0.45, less than or equal to about 0.4, less than or equal to about 0.35, less than or equal to about 0.3, less than or equal to about 0.28, or less than or equal to about 0.25). In an embodiment, the first semiconductor nanocrystal may not include selenium.

The first semiconductor nanocrystal or the core may represent a form in which tellurium is alloyed in a zinc sulfide. The first semiconductor nanocrystal or the core may exhibit two peaks at 2 theta of about 10 degrees to about 30 degrees in the X-ray diffraction spectrum. The first semiconductor nanocrystal or the core may exhibit two peaks at 2 theta of about 40 degrees to about 60 degrees in an X-ray diffraction spectrum.

Figure 4:
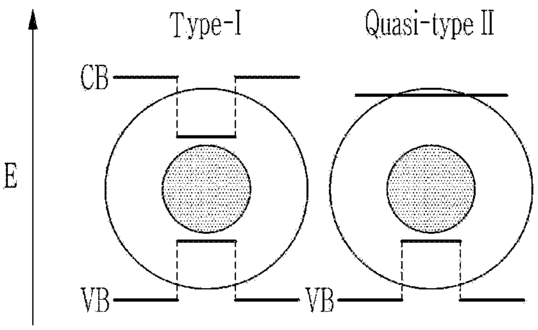
FIG. 4 is a view showing types of band alignment of semiconductor nanoparticles having a core-shell structure.

In an embodiment, the semiconductor nanoparticles may exhibit type-I band alignment, e.g., structure. (Reference: FIG. 4, CB: conduction band, VB: valence band) In an embodiment, a semiconductor nanoparticle having a type-I band alignment between core and shell materials may have a nested band alignment structure (in which a bandgap energy of a core is smaller than that of a shell), wherein electrons and holes may be effectively confined in a core region, luminescence recombination (i.e., radiative recombination) may be enhanced, and the surface of the (optically active) core may be physically separated from surrounding media. A type-I structure of the semiconductor nanoparticle may improve luminance intensity and optical stability.

The present inventors have surprisingly discovered that a semiconductor nanoparticle including a core based on zinc, selenium, and tellurium may exhibit a quasi type-II band alignment and luminance intensity changing according to a voltage. (Refer to FIG. 4) For example, when a luminescent intensity at about 0 V is supposed to be 100%, a luminescent intensity of a ZnTeSe-based semiconductor nanoparticles may be only about 32% at an applied voltage of about 2.6 volts (V).

Without being bound by any particular theory, it is understood that such a PL quenching may be related to the band alignment of core/shell nanoparticles and electron-hole overlap based on the band alignment. In other words, semiconductor nanoparticles having a zinc selenium and tellurium-based core tend to exhibit the quasi type-II structure, e.g., band alignment, and the quasi type-II structure may not provide sufficient electron-hole overlap in an electroluminescent device.

The present inventors have surprisingly discovered that the semiconductor nanoparticles of an embodiment may exhibit type-I band alignment and may have wider electron-hole overlap compared to semiconductor nanoparticles having zinc selenium and tellurium-based cores. Accordingly, when the semiconductor nanoparticles of an embodiment are used in the light emitting layer of the electroluminescent device, a photoluminescence quenching problem due to an increase of an applied voltage may be improved, e.g., solved.

The semiconductor nanoparticles according to an embodiment may have a shell disposed on at least a portion of the first semiconductor nanocrystal (or core). (Refer to FIGS. 5A and 5B)

The shell may include zinc and selenium. The shell may further contain sulfur, tellurium, or a combination thereof. In an embodiment, the shell may not include tellurium. The shell may include semiconductor nanocrystals (second semiconductor nanocrystals, third semiconductor nanocrystals, etc.) having a composition different from that of the first semiconductor nanocrystal.

The shell may include a first shell layer containing zinc, selenium, and optionally further containing sulfur and a second shell layer disposed on the first shell layer and including a third zinc chalcogenide containing zinc, sulfur, and optionally further containing selenium. The second zinc chalcogenide and the third zinc chalcogenide may have different compositions.

Figure 5A:
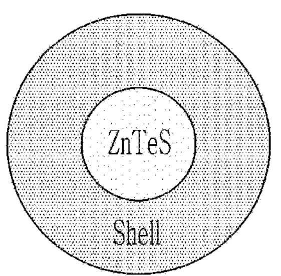
FIG. 5A is a schematic cross-sectional view of a quantum dot according to an embodiment.
Figure 5B:
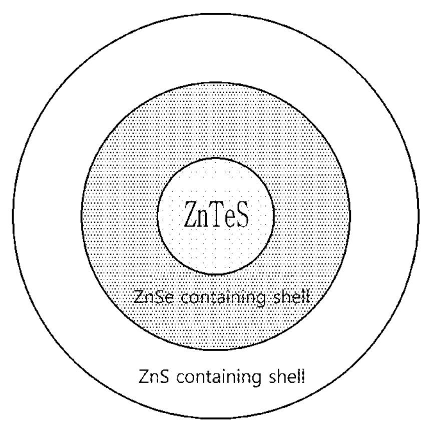
FIG. 5B is a schematic cross-sectional view of a quantum dot according to an embodiment.

The cross-section of the semiconductor nanoparticles in FIGS. 5A and 5B is a circle, but is not limited thereto, and the cross-section of the semiconductor nanoparticles may have any suitable shape. In an embodiment, the semiconductor nanoparticles may have any suitable shape. In an embodiment, the shape may include a sphere, a polyhedron, a pyramid, a multi-pod, a cube, a nanotube, a nanowire, a nanofiber, a nanosheet, a nanoplate, or a combination thereof.

The semiconductor nanocrystals included in the shell may exhibit a wider bandgap energy than the first semiconductor nanocrystals. The semiconductor nanocrystals contained in the shell may be selected to exhibit a type I-band alignment structure.

The shell may include a multilayered shell. Adjacent layers in the multilayered shell may include different semiconductor nanocrystals. The multilayered shell may include a first shell layer including a second semiconductor nanocrystal, and a second shell layer disposed on the first shell layer and including a third semiconductor nanocrystal. The first shell layer may be disposed directly on the core. The second shell layer may be an outermost layer of quantum dots. In the case of a multilayered shell, the bandgap energy of the outermost layer material of the shell may be greater than the bandgap energies of the core and the inner layer material of the shell (layers that are closer to the core). In the case of a multilayered shell, a semiconductor nanocrystal of each layer is selected to have an appropriate bandgap, thereby effectively showing, e.g., exhibiting, a quantum confinement effect.

In the shell, the semiconductor nanocrystals (e.g., the second semiconductor nanocrystals and the third semiconductor nanocrystals) may (each independently) include zinc chalcogenide (e.g., second zinc chalcogenide or third zinc chalcogenide), magnesium chalcogenide, or a combination thereof which has a composition different from that of the first zinc chalcogenide and includes, e.g., contains, selenium.

In an embodiment, the second semiconductor nanocrystals may include a second zinc chalcogenide containing zinc, selenium, and optionally further containing sulfur. The third semiconductor nanocrystals may include a third zinc chalcogenide containing zinc, sulfur, and optionally further containing selenium. In an embodiment, the second semiconductor nanocrystals may not include sulfur. In an embodiment, the third semiconductor nanocrystal may not include selenium. The outer layer (e.g., the second layer) may be the outermost layer of the quantum dots.

The second semiconductor nanocrystal may be a gradient alloy in which each layer in the shell or multilayered shell has a composition that changes in a radial direction. In an embodiment, s content of the sulfur in the semiconductor nanocrystal shell may increase toward the surface of the semiconductor nanoparticles. For example, in the shell, the content of sulfur may have an increased concentration gradient as the distance from the core increases.

In the semiconductor nanoparticle, a mole ratio of sulfur to tellurium (S:Te) may be greater than or equal to about 0.5:1 and less than or equal to about 110:1, and the mole ratio of selenium to tellurium (Se:Te) may be greater than or equal to about 1:1 and less than or equal to about 117:1.

In the semiconductor nanoparticle, a mole ratio of sulfur to tellurium (S:Te) (e.g., as determined by inductively coupled plasma atomic emission spectroscopy (ICP-AES)) may be greater than or equal to about 0.7:1, greater than or equal to about 0.9:1, greater than or equal to about 1:1, greater than or equal to about 1.5:1, greater than or equal to about 2:1, greater than or equal to about 2.5:1, greater than or equal to about 3:1, greater than or equal to about 5:1, greater than or equal to about 7:1, greater than or equal to about 9:1, greater than or equal to about 10:1, greater than or equal to about 15:1, greater than or equal to about 20:1, greater than or equal to about 25:1, greater than or equal to about 30:1, greater than or equal to about 35:1, greater than or equal to about 40:1, greater than or equal to about 45:1, greater than or equal to about 50:1, greater than or equal to about 55:1, greater than or equal to about 57:1, greater than or equal to about 60:1, or greater than or equal to about 65:1. The mole ratio of sulfur to tellurium (S:Te) may be less than or equal to about 100:1, less than or equal to about 95:1, less than or equal to about 90:1, less than or equal to about 85:1, less than or equal to about 80:1, less than or equal to about 75:1, less than or equal to about 70:1, less than or equal to about 65:1, less than or equal to about 59:1, less than or equal to about 50:1, less than or equal to about 40:1, less than or equal to about 30:1, less than or equal to about 20:1, less than or equal to about 10:1, less than or equal to about 9:1, less than or equal to about 8:1, less than or equal to about 7:1, less than or equal to about 6:1, or less than or equal to about 5:1.

In the semiconductor nanoparticle, a mole ratio of selenium to tellurium (Se:Te) (e.g., as determined by inductively coupled plasma atomic emission spectroscopy (ICP-AES)) may be greater than or equal to about 10:1, greater than or equal to about 15:1, greater than or equal to about 20:1, greater than or equal to about 25:1, greater than or equal to about 30:1, greater than or equal to about 35:1, greater than or equal to about 40:1, greater than or equal to about 45:1, greater than or equal to about 50:1, greater than or equal to about 55:1, greater than or equal to about 57:1, greater than or equal to about 60:1, or greater than or equal to about 65:1. The mole ratio of selenium to tellurium (Se:Te) may be less than or equal to about 100:1, less than or equal to about 95:1, less than or equal to about 90:1, less than or equal to about 85:1, less than or equal to about 80:1, less than or equal to about 75:1, less than or equal to about 70:1, less than or equal to about 65:1, or less than or equal to about 59:1.

In the semiconductor nanoparticles, a mole ratio of zinc to tellurium (Zn:Te) may be greater than or equal to about 1:1, greater than or equal to about 10:1, greater than or equal to about 20:1, greater than or equal to about 30:1, greater than or equal to about 40:1, greater than or equal to about 50:1, greater than or equal to about 60:1, greater than or equal to about 70:1, greater than or equal to about 80:1, greater than or equal to about 90:1, greater than or equal to about 95:1, greater than or equal to about 100:1, greater than or equal to about 105:1, greater than or equal to about 110:1, greater than or equal to about 115:1, greater than or equal to about 120:1, greater than or equal to about 125:1, greater than or equal to about 126:1, greater than or equal to about 127:1, greater than or equal to about 128:1, greater than or equal to about 129:1, greater than or equal to about 130:1, or greater than or equal to about 131:1. The mole ratio of zinc to tellurium (Zn:Te) may be less than or equal to about 260:1, less than or equal to about 250:1, less than or equal to about 230:1, less than or equal to about 220:1, less than or equal to about 210:1, less than or equal to about 200:1, less than or equal to about 190:1, less than or equal to about 180:1, less than or equal to about 170:1, less than or equal to about 160:1, less than or equal to about 150:1, less than or equal to about 140:1, less than or equal to about 135:1, less than or equal to about 130:1, less than or equal to about 120:1, or less than or equal to about 110:1.

In the semiconductor nanoparticles, a mole ratio of sulfur to selenium (S:Se) may be greater than or equal to about 0.01:1, greater than or equal to about 0.03:1, greater than or equal to about 0.05:1, greater than or equal to about 0.07:1, greater than or equal to about 0.1:1, greater than or equal to about 0.3:1, greater than or equal to about 0.5:1, greater than or equal to about 0.7:1, greater than or equal to about 0.75:1, greater than or equal to about 0.8:1, greater than or equal to about 0.85:1, greater than or equal to about 0.9:1, greater than or equal to about 0.91:1, greater than or equal to about 0.92:1, greater than or equal to about 0.93:1, greater than or equal to about 0.94:1, greater than or equal to about 0.95:1, greater than or equal to about 0.96:1, greater than or equal to about 0.97:1, greater than or equal to about 0.98:1, greater than or equal to about 0.99:1, or greater than or equal to about 1:1.

In the semiconductor nanoparticles, a mole ratio of sulfur to selenium (S:Se) may be less than or equal to about 3:1, less than or equal to about 2.5:1, less than or equal to about 2:1, less than or equal to about 1.5:1, less than or equal to about 1.4:1, less than or equal to about 1.3:1, less than or equal to about 1.2:1, less than or equal to about 1.1:1, less than or equal to about 1.05:1, less than or equal to about 0.97:1, less than or equal to about 0.95:1, less than or equal to about 0.93:1, less than or equal to about 0.91:1, less than or equal to about 0.9:1, less than or equal to about 0.85:1, less than or equal to about 0.8:1, less than or equal to about 0.75:1, less than or equal to about 0.7:1, less than or equal to about 0.65:1, less than or equal to about 0.6:1, less than or equal to about 0.55:1, less than or equal to about 0.5:1, less than or equal to about 0.45:1, less than or equal to about 0.4:1, less than or equal to about 0.35:1, less than or equal to about 0.3:1, less than or equal to about 0.25:1, less than or equal to about 0.2:1, less than or equal to about 0.15:1, or less than or equal to about 0.1:1.

In the semiconductor nanoparticles, a mole ratio of a sum of Se and S to zinc ((S+Se):Zn) may be greater than or equal to about 0.5:1, greater than or equal to about 0.55:1, greater than or equal to about 0.6:1, greater than or equal to about 0.65:1, greater than or equal to about 0.7:1, greater than or equal to about 0.75:1, greater than or equal to about 0.85:1, greater than or equal to about 0.86:1, greater than or equal to about 0.87:1, greater than or equal to about 0.88:1, greater than or equal to about 0.89:1, or greater than or equal to about 0.9:1. In the semiconductor nanoparticles, the mole ratio of a sum of Se and S to zinc ((S+Se):Zn) may be less than or equal to about 3:1, less than or equal to about 2.5:1, less than or equal to about 2:1, less than or equal to about 1.5:1, less than or equal to about 1.2:1, less than or equal to about 1.1:1, less than or equal to about 1:1, less than or equal to about 0.99:1, less than or equal to about 0.98:1, less than or equal to about 0.97:1, less than or equal to about 0.96:1, less than or equal to about 0.95:1, less than or equal to about 0.94:1, less than or equal to about 0.93:1, less than or equal to about 0.92:1, less than or equal to about 0.91:1, less than or equal to about 0.9:1, or less than or equal to about 0.89:1.

The semiconductor nanoparticles of an embodiment having the aforementioned composition, structure, or a combination thereof may exhibit a distribution in which electrons and holes are concentrated in the core, and for example, may exhibit improved efficiency, life-span, or a combination thereof during electroluminescence.

The semiconductor nanoparticles are configured to emit light having a maximum emission peak wavelength of greater than or equal to about 440 nm and less than or equal to about 580 nm. In an embodiment, the semiconductor nanoparticles may be configured to emit blue light. In an embodiment, the semiconductor nanoparticles may be configured to emit green light.

In an embodiment, the maximum emission peak wavelength of light emitted by the semiconductor nanoparticles may be greater than or equal to about 430 nm, greater than or equal to about 435 nm, greater than or equal to about 440 nm, greater than or equal to about 446 nm, greater than or equal to about 449 nm, greater than or equal to about 450 nm, greater than or equal to about 455 nm, greater than or equal to about 456 nm, greater than or equal to about 457 nm, greater than or equal to about 458 nm, greater than or equal to about 459 nm, greater than or equal to about 460 nm, greater than or equal to about 461 nm, greater than or equal to about 462 nm, greater than or equal to about 463 nm, greater than or equal to about 464 nm, or greater than or equal to about 465 nm.

In an embodiment, the maximum emission peak wavelength of light emitted by the semiconductor nanoparticles may be less than or equal to about 580 nm, less than or equal to about 570 nm, less than or equal to about 565 nm, less than or equal to about 550 nm, less than or equal to about 545 nm, less than or equal to about 535 nm, less than or equal to about 530 nm, less than or equal to about 525 nm, less than or equal to about 520 nm, less than or equal to about 510 nm, less than or equal to about 505 nm, less than or equal to about 500 nm, less than or equal to about 490 nm, less than or equal to about 485 nm, less than or equal to about 480 nm, less than or equal to about 475 nm, or less than or equal to about 470 nm.

In an ultraviolet-visible (UV-Vis) absorption spectrum, a first absorption peak of light emitted by the semiconductor nanoparticles may be in the range of greater than or equal to about 400 nm, greater than or equal to about 405 nm, greater than or equal to about 410 nm, greater than or equal to about 415 nm, greater than or equal to about 420 nm, or greater than or equal to about 425 nm and less than or equal to about 470 nm, less than or equal to about 460 nm, less than or equal to about 455 nm, less than or equal to about 450 nm, less than or equal to about 445 nm, less than or equal to about 440 nm, less than or equal to about 435 nm, less than or equal to about 430 nm, or less than or equal to about 428 nm.

In an embodiment, the semiconductor nanoparticles may exhibit a difference (hereinafter, Stokes shift) between a first absorption peak wavelength and a maximum emission peak wavelength in a relatively wide range. In an embodiment, the Stokes shift of the semiconductor nanoparticles may be in the range of about 25 nm to about 50 nm, about 28 nm to about 49 nm, about 30 nm to about 48 nm, about 33 nm to about 47 nm, about 34 nm to about 46 nm, or a combination thereof.

A maximum emission peak of light emitted by the semiconductor nanoparticles of an embodiment may have a full width at half maximum (FWHM) of about 5 nm to about 90 nm, about 10 nm to about 80 nm, about 15 nm to about 75 nm, about 20 nm to about 70 nm, about 25 nm to about 60 nm, about 30 nm to about 55 nm, about 35 nm to about 50 nm, about 40 nm to about 45 nm, or a combination thereof.

The semiconductor nanoparticles of an embodiment may have, for example, when irradiated with light in a solution state or prepared as a light emitting film, a quantum yield (e.g., absolute quantum yield) of greater than or equal to about 40%, greater than or equal to about 45%, greater than or equal to about 50%, greater than or equal to about 55%, greater than or equal to about 60%, greater than or equal to about 65%, greater than or equal to about 70%, greater than or equal to about 75%, greater than or equal to about 80%, greater than or equal to about 81%, greater than or equal to about 82%, greater than or equal to about 83%, greater than or equal to about 84%, greater than or equal to about 85%, greater than or equal to about 86%, greater than or equal to about 87%, greater than or equal to about 88%, greater than or equal to about 89%, or greater than or equal to about 90%. The light emitting film including the semiconductor nanoparticles may exhibit a quantum yield in the range of about 76% to about 100%, about 80% to about 95%, about 82% to about 92%, or a combination thereof. The quantum yield may be an absolute quantum yield or a relative quantum yield.

In an embodiment, the semiconductor nanoparticles may be prepared according to the methods described herein.

In an embodiment, the method of preparing the population includes: obtaining a first semiconductor nanocrystal (e.g., a core) containing zinc, sulfur, and tellurium; and synthesizing a semiconductor nanocrystal (e.g., a shell, hereinafter also referred to as a shell semiconductor nanocrystal) including a zinc chalcogenide containing selenium in the presence of the first semiconductor nanocrystal, wherein the obtaining of the first semiconductor nanocrystal includes heating a reaction medium including an organic amine compound; and adding a zinc precursor, a tellurium precursor stock solution including a tellurium compound, a reducing compound, and an organic amine compound, and a sulfur precursor, and performing a reaction in the heated reaction medium.

In an embodiment, the reaction medium may not include a copper compound (e.g., an organic copper compound, an inorganic copper compound, a copper chalcogenide, or a combination thereof).

The reaction medium may or may not further include an organic solvent, an organic ligand, or a combination thereof. The heating of the reaction medium may be performed under vacuum (hereinafter referred to as vacuum treatment). The vacuum treatment temperature may be greater than or equal to about 50° C., greater than or equal to about 100° C., or greater than or equal to about 120° C. and less than or equal to about 200° C., or less than or equal to about 150° C. After vacuum treatment of the reaction medium, the reaction medium may be heated to a first reaction temperature. To the reaction medium heated to the first reaction temperature, the zinc precursor, the tellurium stock solution, and the sulfur precursor may be added simultaneously or sequentially.

The zinc precursor may include a Zn metal powder, ZnO, an alkylated Zn compound (e.g., a di(C1 to C30 alkyl) zinc such as diethyl zinc), a Zn alkoxide (e.g., zinc ethoxide), a Zn carboxylate (e.g., zinc acetate), Zn nitrate, Zn perchlorate, Zn sulfate, Zn acetylacetonate, a Zn halide (such as zinc chloride), Zn cyanide, Zn hydroxide, zinc carbonate, zinc peroxide, or a combination thereof. Examples of the zinc precursor include dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, or a combination thereof.

In an embodiment, the zinc precursor may include an alkylated zinc compound. In an embodiment, the zinc precursor may not include zinc acetate. In an embodiment, the zinc precursor may not include zinc chloride.

The tellurium precursor may include tellurium-trioctylphosphine (Te-TOP), tellurium-tributylphosphine (Te-TBP), tellurium-triphenylphosphine (Te-TPP), tellurium-diphenylphosphine (Te-DPP), or a combination thereof, but is not limited thereto.

The reducing agent or reducing compound may include a hydride compound. The hydride compound may include an alkali metal, an alkaline earth metal, aluminum, or a combination thereof. The hydride compound may include a lithium-containing hydride compound, a potassium-containing hydride compound, an aluminum-containing hydride compound, a sodium-containing hydride compound, a lithium aluminum hydride compound, or a combination thereof.

The sulfur precursor may include hexane thiol, octane thiol, decane thiol, dodecane thiol, hexadecane thiol, mercaptopropyl silane, sulfur-trioctylphosphine (S-TOP), sulfur-tributylphosphine (S-TBP), sulfur-triphenylphosphine (S-TPP), sulfur-trioctylamine (S-TOA), bis(trialkylsilyl)sulfide or bis(trialkylsilylalkyl)sulfide (e.g., bistrimethylsilyl sulfide or bis(trimethylsilyl)methyl sulfide), ammonium sulfide, sodium sulfide, or a combination thereof.

In an embodiment, the sulfur precursor may include a compound in which an organic ligand is bonded to sulfur. The organic ligand may include a trialkylsilyl group, a trialkylsilylalkyl group, or a combination thereof. The sulfur precursor may include bis(trialkylsilyl)sulfide, bis(trialkylsilylalkyl)sulfide, or a combination thereof.

The organic amine compound may include a $C_{5-50}$ primary amine compound and optionally, further include a $C_{5-50}$ secondary amine compound, a $C_{5-50}$ tertiary amine compound, or a combination thereof. The primary amine compound may have a $C_{5-50}$ alkenyl group, a $C_{5-50}$ alkynyl group, or a $C_{5-50}$ alkyl group, or a $C_{5-50}$ aryl group. The secondary amine compound or the tertiary amine compound may include a $C_{5-50}$ alkenyl group, a $C_{5-50}$ alkynyl group, or a $C_{5-50}$ alkyl group, a $C_{5-50}$ aryl group, or a combination thereof. In an embodiment, the organic amine compound may be a combination of a primary amine compound and a tertiary amine compound.

The organic solvent and the organic ligand are as described herein.

In the formation of the first semiconductor nanocrystal, a mole ratio of the tellurium precursor to the sulfur precursor may be selected taking into consideration a desired composition ratio of Te:Se in the first semiconductor nanocrystal. In the formation of the first semiconductor nanocrystal, a content of the sulfur precursor per 1 mole of tellurium may be greater than or equal to about 2.4 moles, greater than or equal to about 2.5 moles, greater than or equal to about 2.6 moles, greater than or equal to about 2.7 moles, greater than or equal to about 2.8 moles, greater than or equal to about 2.9 moles, greater than or equal to about 3 moles, greater than or equal to about 3.1 moles, greater than or equal to about 3.2 moles, greater than or equal to about 3.3 moles, greater than or equal to about 3.4 moles, greater than or equal to about 3.5 moles, greater than or equal to about 3.6 moles, greater than or equal to about 3.7 moles, greater than or equal to about 3.8 moles, or greater than or equal to about 3.9 moles. The content of the sulfur precursor per 1 mole of tellurium may be less than or equal to about 5 moles, less than or equal to about 4.5 moles, less than or equal to about 4 moles, less than or equal to about 3.9 moles, less than or equal to about 3.8 moles, less than or equal to about 3.7 moles, less than or equal to about 3.6 moles, less than or equal to about 3.5 moles, less than or equal to about 3.4 moles, less than or equal to about 3.2 moles, less than or equal to about 3.1 moles, or less than or equal to about 3 moles.

Preparation of the tellurium stock solution may include mixing the tellurium precursor with a reducing agent in an organic amine compound. A content of the reducing agent in the tellurium stock solution may be appropriately adjusted and is not particularly limited. In the tellurium stock solution, a content of the reducing agent per 1 mole of tellurium may be greater than or equal to about 0.1 moles, greater than or equal to about 0.5 moles, greater than or equal to about 1 mole, greater than or equal to about 1.5 moles, or greater than or equal to about 2 moles, and less than or equal to about 5 moles, less than or equal to about 4 moles, less than or equal to about 3 moles, less than or equal to about 2.5 moles, or less than or equal to about 2 moles.

In an embodiment, the tellurium stock solution may not include a sulfur precursor. The organic amine compound in the tellurium stock solution may be the same as or different from the organic amine compound in the reaction medium. In an embodiment, the organic amine compound in the tellurium stock solution is as described herein for the organic amine compound.

In the formation of the first semiconductor nanocrystal, a content of the zinc precursor per 1 mole of the total of tellurium and sulfur may be greater than or equal to about 0.5 moles, greater than or equal to about 0.6 moles, greater than or equal to about 0.7 moles, greater than or equal to about 0.8 moles, greater than or equal to about 0.9 moles, greater than or equal to about 0.95 moles, greater than or equal to about 1 mole, greater than or equal to about 1.05 moles, greater than or equal to about 1.1 moles, greater than or equal to about 1.15 moles, greater than or equal to about 1.2 moles, greater than or equal to about 1.25 moles, or greater than or equal to about 1.3 moles. In the formation of the first semiconductor nanocrystal, a content of the zinc precursor per 1 mole of the total of tellurium and sulfur may be less than or equal to about 3 moles, less than or equal to about 2.5 moles, less than or equal to about 2 moles, less than or equal to about 1.5 moles, or less than or equal to about 1.25 moles.

Concentrations of the precursors in the reaction medium are not particularly limited and may be appropriately selected.

The prepared core may be separated from the reaction system and subjected to, e.g., put into, a shell-forming reaction. The separation may include non-solvent precipitation as described herein.

Obtaining shell semiconductor nanocrystals may include performing a reaction between the zinc precursor and the chalcogen precursor in a shell-forming reaction medium including an organic solvent and an organic ligand, for example, at a second reaction temperature, and the chalcogen precursor includes a selenium precursor. The chalcogen precursor may further include a sulfur precursor, a tellurium precursor, or a combination thereof.

In an embodiment, the shell precursors may be sequentially added as a mixture in different proportions during the reaction time to form a shell of a desired composition (e.g., having a gradient or multilayers). In an embodiment, the method may include reacting a zinc precursor with a chalcogen element (e.g., a selenium precursor, a tellurium precursor, or a combination thereof and optionally a sulfur precursor) to provide a nanocrystal layer (e.g., ZnSe layer, ZnTeSe layer, ZnTe layer, ZnSeS layer, ZnTeS layer, ZnTeSeS layer, or a combination thereof) on the first semiconductor nanocrystals, and then reacting a zinc precursor with a sulfur precursor to provide a ZnS layer.

In an embodiment, the method may include reacting a zinc precursor and a selenium precursor and optionally a sulfur precursor, a tellurium precursor, or a combination thereof to form a first shell layer, and subsequently reacting the zinc precursor and the sulfur precursor to form a second shell layer. The content and concentration of each precursor in the shell-forming reaction system may be selected taking into consideration desired core and shell compositions and reactivity between the precursors.

The organic solvent may include a C6 to C22 primary amine such as a hexadecylamine, a C6 to C22 secondary amine such as dioctylamine, a C6 to C40 tertiary amine such as a trioctyl amine, a nitrogen-containing heterocyclic compound such as pyridine, a C6 to C40 olefin such as octadecene, a C6 to C40 aliphatic hydrocarbon such as hexadecane, octadecane, or squalane, an aromatic hydrocarbon substituted with a C6 to C30 alkyl group such as phenyldodecane, phenyltetradecane, or phenyl hexadecane, a primary, secondary, or tertiary phosphine (e.g., trioctylamine) substituted with a, e.g., at least one (e.g., 1, 2, or 3), C6 to C22 alkyl group, a primary, secondary, or tertiary phosphine oxide (e.g., trioctylphosphine oxide) substituted with a (e.g., 1, 2, or 3) C6 to C22 alkyl group, a C12 to C22 aromatic ether such as phenyl ether or benzyl ether, or a combination thereof.

The organic ligand may coordinate the surface of the produced nanocrystal and may have an effect on the light emitting and electrical characteristics as well as may well disperse the nanocrystal in the solution phase. The organic ligand may include, RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', $RPO(OH)_2$, $R_2POOH$, or a combination thereof, wherein R and R' are each independently a C1 to C40 (or C3 to C24) substituted or unsubstituted aliphatic hydrocarbon, a C6 to C40 (or C6 to C24) substituted or unsubstituted aromatic hydrocarbon, or a combination thereof). A mixture of two or more different ligands may be used.

Specific examples of the organic ligand compound may be a thiol such as methane thiol, ethane thiol, propane thiol, butane thiol, pentane thiol, hexane thiol, octane thiol, dodecane thiol, hexadecane thiol, octadecane thiol, or benzyl thiol; a primary, secondary, tertiary amine such as methane amine, ethane amine, propane amine, butane amine, pentane amine, hexane amine, octane amine, dodecane amine, hexadecyl amine, oleyl amine, octadecyl amine, dimethyl amine, diethyl amine, or dipropyl amine; an acid or a fatty acid such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, palmitic acid, or stearic acid; phosphine such as methyl phosphine, ethyl phosphine, propyl phosphine, butyl phosphine, pentyl phosphine, tributylphosphine, or trioctylphosphine; a phosphine oxide compound thereof such as methyl phosphine oxide, ethyl phosphine oxide, propyl phosphine oxide, butyl phosphine oxide, or trioctylphosphine oxide; an aromatic phosphine such as a diphenyl phosphine an oxide compound thereof or a triphenyl phosphine or an oxide compound thereof; a phosphonic acid, and the like, but are not limited thereto. Two or more different organic ligand compounds may be used. In an embodiment, the organic ligand compound may be a combination of RCOOH and amine (e.g., $RNH_2$, $R_2NH$, $R_3N$, or a combination thereof, wherein R is as defined herein).

The selenium precursor may include selenium-trioctylphosphine (Se-TOP), selenium-tributylphosphine (Se-TBP), selenium-triphenylphosphine (Se-TPP), selenium-diphenylphosphine (Se-DPP), or a combination thereof, but is not limited thereto.

The first reaction temperature, the second reaction temperature, or a combination thereof may be a range of about 200° C. to about 340° C., for example, about 230° C. to about 335° C., about 240° C. to about 330° C., about 250° C. to about 320° C., about 260° C. to about 310° C., about 270° C. to about 300° C., about 280° C. to about 290° C., or a combination thereof. The reaction time for the formation of the first semiconductor nanocrystals or the shell is not particularly limited and may be appropriately selected. For example, the reaction time may be greater than or equal to about 5 minutes, greater than or equal to about 10 minutes, greater than or equal to about 15 minutes, greater than or equal to about 20 minutes, greater than or equal to about 25 minutes, greater than or equal to about 30 minutes, greater than or equal to about 35 minutes, greater than or equal to about 40 minutes, greater than or equal to about 45 minutes, or greater than or equal to about 50 minutes, but is not limited thereto. For example, the reaction time may be less than or equal to about 2 hours, less than or equal to about 1 hour, or less than or equal to about 50 minutes, but is not limited thereto. The size of the first semiconductor nanocrystal or core or the size of the shell or the entire semiconductor nanoparticle may be controlled by adjusting the reaction temperature/reaction time/precursor contents.

In an embodiment, the solvent and optionally the organic ligand may be heated (or vacuum-treated) under vacuum to a predetermined temperature (e.g., 100° C. or higher), and may be heated to a predetermined temperature (e.g., 100° C. or higher) after converting the vacuum to an inert gas atmosphere. Subsequently, the core is added thereto, and the shell precursors are sequentially or simultaneously added thereto and then, heated at a predetermined reaction temperature to perform a reaction.

After completing the reaction, a nonsolvent is added to reaction products and nanocrystal particles including, e.g., coordinated with, the ligand compound may be separated. The nonsolvent may be a polar solvent that is miscible with the solvent used in the core formation reaction, shell formation reaction, or a combination thereof and is not capable of dispersing the prepared nanocrystals. The nonsolvent may be selected taking into consideration, e.g., depending on, the solvent used in the reaction and may include, for example, acetone, ethanol, butanol, isopropanol, ethanediol, water, tetrahydrofuran (THF), dimethylsulfoxide (DMSO), diethylether, formaldehyde, acetaldehyde, ethylene glycol, a solvent having a similar solubility parameter to the foregoing solvents, or a combination thereof. The nanocrystal particles may be separated through centrifugation, sedimentation, chromatography, or distillation. The separated nanocrystals may be added to a washing solvent and washed, if desired. The washing solvent has no particular limit and may have a similar solubility parameter to that of the ligand and may, for example, include hexane, heptane, octane, chloroform, toluene, benzene, and the like.

The semiconductor nanoparticles of an embodiment may be non-dispersible or water-insoluble in water, the aforementioned nonsolvent, or a combination thereof.

The semiconductor nanoparticles of an embodiment may be dispersed in the aforementioned organic solvent. In an embodiment, the aforementioned semiconductor nanoparticles may be dispersed in a C6 to C40 aliphatic hydrocarbon, a C6 to C40 substituted or unsubstituted aromatic hydrocarbon, or a combination thereof.

In the light emitting device, a thickness of the light emitting layer may be appropriately selected. In an embodiment, the light emitting layer may include a monolayer of nanoparticles. In an embodiment, the light emitting layer may include one or more, for example, two or more, three or more, or four or more and 20 or less, 10 or less, 9 or less, 8 or less, 7 or less, or 6 or less monolayers of nanoparticles. The light emitting layer may have a thickness of greater than or equal to about 5 nm, for example, greater than or equal to about 10 nm, greater than or equal to about 20 nm, or greater than or equal to about 30 nm and less than or equal to about 200 nm, less than or equal to about 150 nm, less than or equal to about 100 nm, less than or equal to about 90 nm, less than or equal to about 80 nm, less than or equal to about 70 nm, less than or equal to about 60 nm, or less than or equal to about 50 nm. The light emitting layer may have a thickness of, for example, about 10 nm to about 150 nm, about 20 nm to about 100 nm, or about 30 nm to about 50 nm.

Forming the light emitting layer may be performed by obtaining a composition including nanoparticles (configured to emit desired light) and applying or depositing the composition on a substrate or charge auxiliary layer in an appropriate manner (e.g., by spin coating, inkjet printing, etc.).

The electroluminescent device may include a charge (hole or electron) auxiliary layer between the first electrode and the second electrode (e.g., the first electrode and the second electrode). For example, in the electroluminescent display device, the hole auxiliary layer 20 may be disposed between the first electrode 10 and the light emitting layer 30, and/or the electron auxiliary layer 40 may be included between the second electrode 50 and the light emitting layer 30. (Refer to FIGS. 2 and 3)

The light emitting device according to an embodiment may further include a hole auxiliary layer. The hole auxiliary layer 20 is disposed between the first electrode 10 and the light emitting layer 30. The hole auxiliary layer 20 may include a hole injection layer, a hole transport layer, an electron (or hole) blocking layer, or a combination thereof. The hole auxiliary layer 20 may be a layer of a single component or a multilayer structure in which adjacent layers include different components.

The HOMO energy level of the hole auxiliary layer 20 may have a HOMO energy level that can be matched with the HOMO energy level of the light emitting layer 30 in order to enhance mobility of holes transferred from the hole auxiliary layer 20 to the light emitting layer 30. In an embodiment, the hole auxiliary layer 20 may include a hole injection layer disposed close to the first electrode 10 and a hole transport layer disposed close to the light emitting layer 30.

The material included in the hole auxiliary layer 20 (e.g., a hole transport layer, a hole injection layer, or an electron blocking layer) is not particularly limited, and may include, for example, poly(9,9-dioctyl-fluorene-co-N-(4)-butylphenyl)-diphenylamine) (TFB), polyarylamine, poly(N-vinylcarbazole), poly(3,4-ethylenedioxythiophene) (PEDOT), poly(3,4-ethylenedioxythiophene) polystyrene sulfonate (PEDOT:PSS), polyaniline, polypyrrole, N,N,N',N'-tetrakis (4-methoxyphenyl)-benzidine (TPD), 4,4'-bis[N-(1-naphthyl)-N-phenyl-amino]biphenyl (α-NPD), (4,4',4"-Tris[phenyl(m-tolyl)amino]triphenylamine (m-MTDATA), 4,4',4"-tris(N-carbazolyl)-triphenylamine (TCTA), 1,1-bis[(di-4-toylamino)phenylcyclohexane (TAPC), a p-type metal oxide (e.g., NiO, $WO_3$, $MoO_3$, etc.), a carbon-based material such as graphene oxide, or a combination thereof, but is not limited thereto.

In the hole auxiliary layer, the thickness of each layer may be appropriately selected. For example, the thickness of each layer may be greater than or equal to about 5 nm, greater than or equal to about 10 nm, greater than or equal to about 15 nm, or greater than or equal to about 20 nm and less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, less than or equal to about 35 nm, or less than or equal to about 30 nm, but is not limited thereto.

The electron auxiliary layer 40 is disposed between the light emitting layer 30 and the second electrode 50. The electron auxiliary layer 40 may include, for example, an electron injection layer, an electron transport layer, a hole (or electron) blocking layer, or a combination thereof. The electron auxiliary layer may include, for example, an electron injection layer (EIL) that facilitates injection of electrons, an electron transport layer (ETL) that facilitates transport of electrons, a hole blocking layer (HBL) that blocks the movement of holes, or a combination thereof.

In an embodiment, the electron injection layer may be disposed between the electron transport layer and the second electrode. For example, the hole blocking layer may be disposed between the light emitting layer and the electron transport (injection) layer, but is not limited thereto. The thickness of each layer may be selected appropriately. For example, the thickness of each layer may be greater than or equal to about 1 nm and less than or equal to about 500 nm, but is not limited thereto. The electron injection layer may be an organic layer formed by vapor deposition. The electron transport layer may include inorganic oxide nanoparticles or may be an organic layer formed by vapor deposition.

The electron transport layer (ETL) the electron injection layer, the hole blocking layer, or a combination thereof may include, for example, 1,4,5,8-naphthalene-tetracarboxylic dian hydride (NTCDA), bathocuproine (BCP), tris[3-(3-pyridyl)-mesityl]borane (3TPYMB), LiF, tris(8-hydroxyquinolinato)aluminum ($Alq_3$), tris(8-hydroxyquinolinato) gallium ($Gaq_3$), tris(8-hydroxyquinolinato)indium ($Inq_3$), bis-(8-hydroxyquinolinato)zinc ($Znq_2$), bis[2-(2-hydroxyphenyl)benzothiazolato]zinc ($Zn(BTZ)_2$), bis(10-hydroxybenzo[H]quinolinato)beryllium ($BeBq_2$), 8-(4-(4,6-di(naphthalen-2-yl)-1,3,5-triazin-2-yl)phenyl)quinolone (ET204), 8-hydroxyquinolinato lithium (Liq), an n-type metal oxide (e.g., ZnO, $HfO_2$, etc.) or a combination thereof, but is not limited thereto.

The electron auxiliary layer 40 may include an electron transport layer. The electron transport layer may include a plurality of nanoparticles. The plurality of nanoparticles may include a metal oxide containing zinc.

The metal oxide may include zinc oxide, zinc magnesium oxide, or a combination thereof. The metal oxide may include $Zn_{1-x}M_xO$, wherein M is Mg, Ca, Zr, W, Li, Ti, Y, Al, or a combination thereof and $0 \leq x \leq 0.5$. In an embodiment, M may be magnesium (Mg). In an embodiment, x may be greater than or equal to about 0.01 and less than or equal to about 0.3, for example, less than or equal to about 0.25, less than or equal to about 0.2, or less than or equal to about 0.15.

The absolute value of the LUMO of the aforementioned nanoparticles included in the light emitting layer may be greater or smaller than the absolute value of the LUMO of the metal oxide. The average size of the nanoparticles may be greater than or equal to about 1 nm, for example, greater than or equal to about 1.5 nm, greater than or equal to about 2 nm, greater than or equal to about 2.5 nm, or greater than or equal to about 3 nm and less than or equal to about 10 nm, less than or equal to about 9 nm, less than or equal to about 8 nm, less than or equal to about 7 nm, less than or equal to about 6 nm, or less than or equal to about 5 nm.

In an embodiment, each thickness of the electron auxiliary layer 40 (e.g., electron injection layer, electron transport layer, or hole blocking layer) may be greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, greater than or equal to about 15 nm, greater than or equal to about 16 nm, greater than or equal to about 17 nm, greater than or equal to about 18 nm, greater than or equal to about 19 nm, or greater than or equal to about 20 nm, and less than or equal to about 120 nm, less than or equal to about 110 nm, less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, or less than or equal to about 25 nm, but is not limited thereto.

A device according to an embodiment may have a normal, e.g., non-inverted, structure. In an embodiment, in the device, the first electrode 10 disposed on the transparent substrate 100 may include a metal oxide-based transparent electrode (e.g., an ITO electrode), and the second electrode 50 facing the first electrode 10 may include a conductive metal (e.g., having a relatively low work function, Mg, Al, etc.). The hole auxiliary layer 20 (e.g., a hole injection layer such as PEDOT:PSS, a p-type metal oxide, or a combination thereof; a hole transport layer such as TFB, poly(9-vinylcarbazole) (PVK), or a combination thereof; or a combination thereof) may be provided between the transparent electrode 10 and the light emitting layer 30. The hole injection layer may be disposed close to the transparent electrode and the hole transport layer may be disposed close to the light emitting layer. The electron auxiliary layer 40 such as an electron injection/transport layer may be disposed between the light emitting layer 30 and the second electrode 50. (Refer to FIG. 2)

A device according to an embodiment may have an inverted structure. Herein, the second electrode 50 disposed on the transparent substrate 100 may include a metal oxide-based transparent electrode (e.g., ITO), and the first electrode 10 facing the second electrode 50 may include a metal (e.g., having a relatively high work function, Au, Ag, etc.). For example, an (optionally doped) n-type metal oxide (crystalline Zn metal oxide) or the like may be disposed as an electron auxiliary layer 40 (e.g., an electron transport layer) between the transparent electrode 50 and the light emitting layer 30. $MoO_3$ or other p-type metal oxide may be disposed as a hole auxiliary layer 20 (e.g., a hole transport layer including TFB, PVK, or a combination thereof; a hole injection layer including $MoO_3$ or other p-type metal oxide; or a combination thereof) between the metal first electrode 10 and the light emitting layer 30. (Refer to FIG. 3)

The aforementioned device may be manufactured by an appropriate method. For example, the electroluminescent device may be manufactured by optionally forming a hole auxiliary layer (e.g., by deposition or coating) on a substrate on which an electrode, forming a light emitting layer including nanoparticles (e.g., a pattern of the aforementioned nanoparticles), and forming (optionally, an electron auxiliary layer and) an electrode (e.g., by vapor deposition or coating) on the light emitting layer. A method of forming the electrode/hole auxiliary layer/electron auxiliary layer may be appropriately selected and is not particularly limited.

The electroluminescent device may be configured to emit red light, green light, or blue light. The wavelength ranges of red light, green light, and blue light are as described herein.

A maximum external quantum efficiency of the electroluminescent device may be greater than or equal to about 4%, greater than or equal to about 5%, greater than or equal to about 6%, greater than or equal to about 7%, greater than or equal to about 8%, greater than or equal to about 9%, or greater than or equal to about 10%. The maximum external quantum efficiency of the electroluminescent device may be less than or equal to less than or equal to about 40%, less than or equal to about 30%, or less than or equal to about 20%.

The electroluminescent device may have maximum luminance within a range of about 10,000 nit (cd/$m^2$) to about 1,000,000 nit, about 20,000 nit to about 900,000 nit, about 30,000 nit to about 800,000 nit, about 40,000 nit to about 700,000 nit, about 50,000 nit to about 600,000 nit, about 60,000 nit to about 500,000 nit, about 70,000 nit to about 400,000 nit, about 80,000 nit to about 300,000 nit, about 90,000 nit to about 200,000 nit, about 100,000 nit to about 200,000 nit, or a combination thereof.

In an embodiment, a display device may include the aforementioned electroluminescent device.

The display device may include a first pixel and a second pixel configured to emit light of a color differing from that of the first pixel. In the first pixel, the second pixel, or a combination thereof, the electroluminescent device according to an embodiment may be disposed.

The display device may include a portable terminal device, a monitor, a laptop, a television, an electric sign board, a camera, or an electronic component.

Hereinafter, specific examples are illustrated. However, these examples are exemplary, and the present disclosure is not limited thereto.

EXAMPLES

Analysis Methods

1. Ultraviolet-Visible (UV-Vis) Spectroscopic Analysis

Ultraviolet (UV) spectroscopic analysis is performed using a Shimadzu UV-2600 UV-Vis spectrophotometer and UV-Visible absorption spectra are obtained.

2. Photoluminescence Analysis and Absolute Quantum Yield (QY) Measurement

Photoluminescence spectroscopic analysis of the semiconductor nanoparticles at room temperature is performed using Hitachi F-7100 spectrometer and Hamamatsu Absolute PL Quantum Yield Spectrometer C11347.

3. Transmission Electron Microscopic Analysis

A transmission electron microscopic analysis of the prepared nanoparticles is performed using an UT F30 Tecnai electron microscope.

4. Inductively Coupled Plasma (ICP) Analysis

An inductively coupled plasma atomic emission spectroscopy (ICP-AES) is performed using Shimadzu ICPS-8100.

5. X-Ray Diffraction (XRD) Analysis

An XRD analysis is performed using a Philips XPert PRO instrument with power of 3 kilowatts (kW) and thus a crystal structure of the semiconductor nanocrystals is examined.

6. Electroluminescence Spectroscopic Analysis

A current according to a voltage is measured with a Keithley 2635B source meter, while the voltage is applied, and a CS2000 spectrometer is used to measure electroluminescence properties (e.g., luminance or efficiency).

The following synthesis is performed under an inert gas atmosphere (under a nitrogen flowing condition), unless otherwise specified. A precursor content is a molar content, unless otherwise specified.

Example 1

1. Tellurium is dispersed in trioctylphosphine (TOP) to prepare a 0.5 molar (M) Te/TOP solution. Te/TOP is added together with lithium aluminum hydride (LAH, Cas No.: 16853-853) to oleylamine to prepare a Te stock solution.

A 300 milliliter (mL) reaction flask containing oleylamine is heated to 120° C. under vacuum, and one hour later, after converting an atmosphere of the reactor to nitrogen, the flask is heated to 250° C. Subsequently, diethyl zinc, the Te stock solution, and bis(trimethylsilyl)sulfide are added to the reaction flask and reacted for 40 minutes.

When the reaction is completed, after rapidly cooling the reaction solution to room temperature, ethanol is added thereto, and precipitates obtained through centrifuging the mixture are dispersed in hexane, obtaining ZnTeS core particles. As a result of transmission electron microscopy, the cores have an average size of about 2 to 5 nanometers (nm).

The Te and S precursors are used in a content ratio of about 1:3. The core particles are adjusted to have a mole ratio shown in Table 1. A mole ratio of a total sum of tellurium and sulfur to zinc is 1:1.2. A mole ratio of LAH to tellurium is 0.9:1.

An X-ray diffraction analysis is performed with respect to the prepared core particles. As a result, the synthesized core particles are confirmed to have a ZnTeS alloyed structure based on ZnS.

2. Selenium and sulfur are dispersed in trioctylphosphine (TOP) to obtain a 2 molar (M) Se/TOP solution and a 1 M S/TOP solution.

Zinc acetate and oleic acid are put in a 300 mL reaction flask containing trioctylamine (TOA) and vacuum-treated at 120° C. The atmosphere of the flask is internally substituted with nitrogen ($N_2$). While the reaction flask is heated to 340° C., the hexane dispersion of the ZnTeS core particles is rapidly added thereto, and Se/TOP is added thereto, performing a reaction between zinc precursor and Se precursor. A total reaction time is 20 minutes.

When the reaction is completed, the reactor is cooled to room temperature, and ethanol is added to the reaction solution, precipitating nanoparticles. The precipitates are centrifuged and recovered to obtain the final semiconductor nanoparticles, which are dispersed in octane.

Contents of the precursors used for forming a shell is adjusted to obtain a mole ratio summarized in Table 1 in final semiconductor nanoparticles.

3. UV-Vis spectroscopy, a photoluminescence analysis, and an ICP analysis are performed with respect to the prepared core particles and semiconductor nanoparticles, and the results are shown in Tables 1 and 2.

The semiconductor nanoparticles of Example 1 were found to have a full width at half maximum (FWHM) of 61 nm.

Example 2

1. Core particles are prepared in the same manner as in Example 1 except that the mole ratio of precursors is changed to obtain an element ratio shown in Table 1.

2. Sulfur is dispersed in trioctylphosphine (TOP), to provide a 1 M S/TOP solution. A shell is formed in the same manner as in Example 1 except that the obtained core particles are used and reacted with a selenium precursor and a zinc precursor, and subsequently, a zinc precursor with S/TOP is added to the reactor and then, reacted to form a ZnS layer.

3. A transmission electron microscopy energy-dispersive X-ray (TEM-EDX) analysis, UV-Vis spectroscopy, a photoluminescence analysis, and an ICP analysis are performed with respect to the prepared core particles and semiconductor nanoparticles, and the results are shown in Tables 1 and 2.

The prepared semiconductor nanoparticles of Example 2 have a full width at half maximum (FWHM) of about 60 nm.

The semiconductor nanoparticles of Example 2 have an average size of 8.1 nm and a standard deviation of 6%.

Comparative Example 1

1. Selenium and tellurium are dispersed in trioctylphosphine (TOP), to provide a 2 molar (M) Se/TOP stock solution and a 0.1 M Te/TOP stock solution.

In a 300 mL reaction flask containing trioctylamine, 4.5 millimoles (mmol) of zinc acetate with oleic acid are added and then heated to 120° C. under vacuum. After 1 hour, an atmosphere of the reactor is converted with inert gas.

After heating the reactor to 300° C., the Se/TOP stock solution and the Te/TOP stock solution in a Te/Se ratio=1/20 are rapidly injected thereinto. When reaction is completed, the reaction solution is rapidly cooled to room temperature, ethanol is added thereto, and precipitates obtained by centrifuging the mixture are dispersed in hexane, to provide ZnSeTe cores. The cores have an average size of about 3 nm.

2. In a 300 mL reaction flask containing TOA, zinc acetate with oleic acid is added, and then vacuum-treated at 120° C. The atmosphere of the flask is internally substituted with nitrogen ($N_2$). While heating the reaction flask to 340° C., the hexane dispersion of the ZnSeTe cores is rapidly added thereto, and the Se/TOP stock solution is added thereto, performing a reaction between zinc precursor and Se precursor.

Total reaction time is 180 minutes.

When the reaction is completed, the reactor is cooled to room temperature, and ethanol is added to the reaction solution, precipitating the prepared nanoparticles. The precipitates are centrifuged and recovered, and the obtained semiconductor nanoparticles are dispersed in octane.

UV-Vis spectroscopy, a photoluminescence analysis, and an ICP analysis of the prepared core particles and semiconductor nanoparticles are performed, and the results are shown in Tables 1 and 2.

TABLE 1

| | S:Te | Zn:Te | Se:Te | S:Se |
|---|---|---|---|---|
| Comparative Example | 0:1 | 260:1 | 238:1 | 0:1 |
| Example 1 | 3:1 | 105:1 | 60:1 | 0.05:1 |
| Example 2 | 58:1 | 132:1 | 60:1 | 0.96:1 |

TABLE 2

| | Composition | UV $1^{st}$ Absorption peak | Photoluminescence Properties Peak | Absolute quantum yield (%) |
|---|---|---|---|---|
| Comparative Example | $ZnTe_{0.067}Se_{0.93}$/ZnSe | 433 nm | 455 nm | 32 |
| Example 1 | $ZnTe_{0.25}S_{0.75}$/ZnSe | 415 nm | 464 nm | 56 |
| Example 2 | $ZnTe_{0.25}S_{0.75}$/ZnSe/ZnS | 425 nm | 459 nm | 91 |

Referring to the result of the tables, the semiconductor nanoparticles (quantum dots) according to an embodiment (Example 1 and Example 2) exhibit significantly improved absolute quantum efficiency, compared with the quantum dots of the Comparative Example. Without being bound by any particular theory, it is understood that Examples 1 and 2 may realize band alignment with a type I structure and increase luminescent recombination of electrons-holes.

Experimental Example 1

The ZnTeS core compositions used in Examples 1 and 2 and the ZnTeSe core composition used in Comparative Example 1 are calculated with respect to an electron-hole overlap according to a core size by using Effective Mass Approximation (EMA), and the results are shown in Table 3.

TABLE 3

| Core size (nm) | $ZnTe_{0.25}S_{0.75}$ | $ZnTe_{0.067}Se_{0.93}$ | Difference (%) |
|---|---|---|---|
| 3.4 | 0.79 | 0.73 | 6 |
| 3.6 | 0.85 | 0.76 | 9 |
| 3.8 | 0.89 | 0.78 | 11 |
| 4.0 | 0.94 | 0.80 | 14 |
| 4.2 | 0.96 | 0.82 | 14 |
| 4.4 | 0.97 | 0.85 | 12 |

Referring to the results of the table, the core compositions of Examples 1 and 2 provide an increased electron-hole overlap, compared with that of the Comparative Example.

Example 3

The semiconductor nanoparticles of Example 2 are used to manufacture a light emitting device with a structure of indium tin oxide (ITO)/poly(3,4-ethylenedioxythiophene) (PEDOT)/poly(9,9-dioctyl-fluorene-co-N-(4)-butylphenyl)-diphenylamine) (TFB) (250 Å)/semiconductor nanoparticle light emitting layer (360 Å)/ZnMgO (240 Å)/Al and then, measured with respect to electroluminescent properties.

On a glass substrate deposited with an ITO electrode (first electrode), poly(3,4-ethylenedioxythiophene) polystyrene sulfonate (PEDOT:PSS) and TFB (or poly(9-vinylcarbazole) (PVK)) layers are formed as a hole injection layer (HIL) and a hole transport layer (HTL) in a spin coating method. On the formed TFB layer (25 nm), the semiconductor nanoparticle solution of Example 2 is spin-coated to form a light emitting layer. On the light emitting layer, a zinc magnesium oxide nanoparticle layer as the electron auxiliary layer is formed, and then, an Al electrode is formed through deposition thereon, manufacturing a light emitting device.

After measurement, the manufactured electroluminescent device exhibits relatively high electroluminescent properties.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. An electroluminescent device, comprising a first electrode and a second electrode spaced apart from each other, and a light emitting layer disposed between the first electrode and the second electrode, the light emitting layer comprising semiconductor nanoparticles, wherein the semiconductor nanoparticles do not comprise cadmium, the semiconductor nanoparticles comprise zinc, selenium, tellurium, and sulfur, the semiconductor nanoparticles have a core-shell structure comprising a core comprising a first semiconductor nanocrystal and a shell disposed on the core, the first semiconductor nanocrystals comprise a first zinc chalcogenide comprising sulfur, wherein in the semiconductor nanoparticles, a mole ratio of sulfur to tellurium is greater than or equal to about 0.5:1 and less than or equal to about 110:1, wherein the semiconductor nanoparticles are configured to emit light having a maximum emission peak wavelength of greater than or equal to about 440 nanometers and less than or equal to about 580 nanometers, wherein the semiconductor nanoparticles have a quantum yield of greater than or equal to about 40%, and wherein a mole ratio of selenium to tellurium is greater than or equal to about 25:1-1:1 and less than or equal to about 117:1.

2. The electroluminescent device of claim 1, wherein the maximum emission peak wavelength of the semiconductor nanocrystals is greater than or equal to about 445 nanometers and less than or equal to about 480 nanometers, and the quantum yield of the semiconductor nanoparticles is greater than or equal to about 50%.

3. The electroluminescent device of claim 1, wherein the maximum emission peak wavelength of the semiconductor nanocrystals is greater than or equal to about 455 nanometers and less than or equal to about 470 nanometers, and the quantum yield of the semiconductor nanoparticles is greater than or equal to about 80%.

4. The electroluminescent device of claim 1, wherein a full width at half maximum of a maximum emission peak of light emitted by the semiconductor nanocrystals is greater than or equal to about 10 nanometers and less than or equal to about 80 nanometers.

5. The electroluminescent device of claim 1, wherein the electroluminescent device further comprises a hole auxiliary layer between the light emitting layer and the first electrode, the electroluminescent device further comprises an electron auxiliary layer between the light emitting layer and the second electrode, or the electroluminescent device further comprises a hole auxiliary layer between the light emitting layer and the first electrode and an electron auxiliary layer between the light emitting layer and the second electrode.

6. The electroluminescent device of claim 5, wherein the electroluminescent device further comprises the hole auxiliary layer; and the hole auxiliary layer comprises a hole transport layer comprising an organic polymer compound, or wherein the electroluminescent device further comprises the electron auxiliary layer; and the electron auxiliary layer comprises zinc magnesium metal oxide nanoparticles.

7. The electroluminescent device of claim 1, wherein the semiconductor nanocrystal particles have an average particle size of greater than or equal to about 3 nanometers and less than or equal to about 50 nanometers.

8. The electroluminescent device of claim 1, wherein in the semiconductor nanoparticles, a mole ratio of sulfur to tellurium (S:Te) is greater than or equal to about 1:1 and less than or equal to about 85:1, or a mole ratio of selenium to tellurium (Se:Te) is greater than or equal to about 30:1-10:1 and less than or equal to about 80:1.

9. The electroluminescent device of claim 1, wherein in the semiconductor nanoparticles, a mole ratio of zinc to tellurium (Zn:Te) is greater than or equal to 1:1 and less than or equal to about 250:1, and a mole ratio of sulfur to selenium (S:Se) is greater than or equal to 0.01:1 and less than or equal to about 3:1.

10. The electroluminescent device of claim 1, wherein the first zinc chalcogenide further comprises tellurium.

11. The electroluminescent device of claim 1, wherein the shell comprises a second zinc chalcogenide comprising selenium having a different composition from the first zinc chalcogenide, a magnesium chalcogenide, or a combination thereof.

12. The electroluminescent device of claim 1, wherein the shell comprises a first shell layer comprising zinc, selenium, and optionally further comprising sulfur, and a second shell layer disposed on the first layer, the second shell layer comprising a third zinc chalcogenide comprising zinc, sulfur, and optionally further comprising selenium, and the second zinc chalcogenide and the third zinc chalcogenide have different compositions.

13. The electroluminescent device of claim 1, wherein the shell does not comprise tellurium.

14. The electroluminescent device of claim 1, wherein the first semiconductor nanocrystal does not comprise selenium.

15. A display device comprising the electroluminescent device of claim 1.

16. The display device of claim 15, wherein the display device comprises a portable terminal device, a monitor, a laptop, a television, an electric sign board, a camera, or an electronic component.

17. A population comprising a plurality of semiconductor nanoparticles comprising zinc, selenium, tellurium, and sulfur, wherein the semiconductor nanoparticles do not comprise cadmium, wherein in the semiconductor nanoparticles, a mole ratio of sulfur to tellurium is greater than or equal to about 1:1 and less than or equal to about 110:1, the semiconductor nanoparticles are configured to emit light having a maximum emission peak wavelength of greater than or equal to about 440 nanometers and less than or equal to about 580 nanometers, the semiconductor nanoparticles exhibit a quantum yield of greater than or equal to about 80%, and wherein a mole ratio of selenium to tellurium is greater than or equal to about 25:1-1:1 and less than or equal to about 117:1.

18. The population of claim 17, wherein the semiconductor nanoparticles exhibit a quantum yield of greater than or equal to about 90%.

19. The population of claim 17, wherein in the semiconductor nanoparticles, the mole ratio of sulfur to tellurium (S:Te) is greater than or equal to about 1:1 and less than or equal to about 85:1, the mole ratio of sulfur to tellurium (S:Te) is greater than or equal to about 10:1 and less than or equal to about 80:1, a mole ratio of zinc to tellurium (Zn:Te) is greater than or equal to about 80:1 and less than or equal to about 250:1, or a mole ratio of sulfur to selenium is greater than or equal to 0.01:1 and less than or equal to about 1.3:1.

20. The population of claim 17, wherein the semiconductor nanoparticles have a core-shell structure comprising a core comprising a first semiconductor nanocrystal and a shell disposed on the core, the first semiconductor nanocrystal comprises tellurium, and the shell does not comprise tellurium.

21. A semiconductor nanoparticle comprising a core comprising a first semiconductor nanocrystal comprising $ZnTe_xS_{1-x}$, wherein x is greater than or equal to about 0.2 and less than or equal to about 0.5; and a shell disposed on the core, the shell comprising zinc and selenium, wherein in the semiconductor nanoparticle, a mole ratio of sulfur to tellurium is greater than or equal to about 0.5:1 and less than or equal to about 110:1, and the semiconductor nanoparticle is configured to emit light having a maximum emission peak wavelength of greater than or equal to about 440 nanometers and less than or equal to about 580 nanometers, and optionally wherein a mole ratio of selenium to tellurium is greater than or equal to about 1:1 and less than or equal to about 117:1.

* * * * *